(12) United States Patent
Fukuzumi et al.

(10) Patent No.: US 12,419,055 B2
(45) Date of Patent: Sep. 16, 2025

(54) SEMICONDUCTOR MEMORY DEVICE HAVING A CIRCUIT CHIP BONDED TO A MEMORY ARRAY CHIP AND INCLUDING A SOLID-STATE DRIVE CONTROLLER AND A CONTROL CIRCUIT

(71) Applicant: Kioxia Corporation, Tokyo (JP)

(72) Inventors: Yoshiaki Fukuzumi, Yokkaichi (JP);
Hideaki Aochi, Yokkaichi (JP); Mie Matsuo, Yokkaichi (JP); Kenichiro Yoshii, Bunkyo (JP); Koichiro Shindo, Yokohama (JP); Kazushige Kawasaki, Kawasaki (JP); Tomoya Sanuki, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 113 days.

(21) Appl. No.: 18/519,872

(22) Filed: Nov. 27, 2023

(65) Prior Publication Data

US 2024/0099013 A1  Mar. 21, 2024

Related U.S. Application Data

(63) Continuation of application No. 17/113,285, filed on Dec. 7, 2020, now Pat. No. 11,871,576, which is a
(Continued)

(30) Foreign Application Priority Data

Sep. 12, 2014  (JP) .................................. 2014-186684

(51) Int. Cl.
*H10B 43/40* (2023.01)
*H01L 21/18* (2006.01)
(Continued)

(52) U.S. Cl.
CPC .......... *H10B 43/40* (2023.02); *H01L 21/185* (2013.01); *H01L 21/76898* (2013.01);
(Continued)

(58) Field of Classification Search
CPC ........ H10B 41/27; H10B 41/30; H10B 41/35; H10B 43/27; H10B 43/30; H10B 43/35;
(Continued)

(56) References Cited

U.S. PATENT DOCUMENTS 7,623,384 B2  11/2009  Iwata
7,936,004 B2   5/2011  Kito et al.
(Continued)

FOREIGN PATENT DOCUMENTS

JP  2002-110907 A  4/2002
JP  2009-146954 A  7/2009
(Continued)

*Primary Examiner* — Younes Boulghassoul
(74) *Attorney, Agent, or Firm* — Oblon, McClelland, Maier &Neustadt, L.L.P.

(57) ABSTRACT

According to one embodiment, the array chip includes a three-dimensionally disposed plurality of memory cells and a memory-side interconnection layer connected to the memory cells. The circuit chip includes a substrate, a control circuit provided on the substrate, and a circuit-side interconnection layer provided on the control circuit and connected to the control circuit. The circuit chip is stuck to the array chip with the circuit-side interconnection layer facing to the memory-side interconnection layer. The bonding metal is provided between the memory-side interconnection layer and the circuit-side interconnection layer. The bonding metal is bonded to the memory-side interconnection layer and the circuit-side interconnection layer.

2 Claims, 33 Drawing Sheets

Related U.S. Application Data continuation of application No. 16/409,637, filed on May 10, 2019, now Pat. No. 10,892,269, which is a continuation-in-part of application No. 16/121,123, filed on Sep. 4, 2018, now abandoned, which is a continuation-in-part of application No. 15/388,318, filed on Dec. 22, 2016, now Pat. No. 10,090,315, which is a continuation of application No. 14/806,034, filed on Jul. 22, 2015, now Pat. No. 9,558,945.

(51) Int. Cl.
    *H01L 21/768* (2006.01)
    *H01L 23/00* (2006.01)
    *H01L 25/065* (2023.01)
    *H01L 25/18* (2023.01)
    *H10B 43/27* (2023.01)
    *H10B 43/30* (2023.01)
    *H10B 43/50* (2023.01)

(52) U.S. Cl.
CPC .......... *H01L 24/80* (2013.01); *H01L 25/0657* (2013.01); *H01L 25/18* (2013.01); *H10B 43/27* (2023.02); *H10B 43/30* (2023.02); *H10B 43/50* (2023.02); *H01L 2224/08145* (2013.01)

(58) Field of Classification Search
CPC . H01L 21/185; H01L 21/187; H01L 21/2007; H01L 24/80; H01L 24/89; H01L 24/08; H01L 24/09; H01L 2224/08145–08148; H01L 2224/80895; H01L 2224/80896; H01L 25/043; H01L 25/0652; H01L 25/0657; H01L 25/071; H01L 25/074; H01L 25/0756; H01L 25/112; H01L 25/117; H10D 88/00; H10D 88/01
See application file for complete search history.

(56) References Cited

U.S. PATENT DOCUMENTS

| | | |
|---|---|---|
| 8,044,448 B2 | 10/2011 | Kamigaichi et al. |
| 8,288,816 B2 | 10/2012 | Komori |
| 8,338,882 B2 | 12/2012 | Tanaka |
| 8,372,720 B2 | 2/2013 | Fukuzumi et al. |
| 8,476,708 B2 | 7/2013 | Fukuzumi et al. |
| 8,593,869 B2 | 11/2013 | Tanzawa |
| 9,634,023 B2 | 4/2017 | Lee |
| 10,074,667 B1 | 9/2018 | Higashi |
| 10,147,732 B1 | 12/2018 | Hu |
| 10,510,415 B1 | 12/2019 | Huo |
| 10,629,616 B1 | 4/2020 | Kai |
| 10,665,580 B1 | 5/2020 | Hosoda |
| 10,665,581 B1 | 5/2020 | Zhou |
| 10,892,270 B2 | 1/2021 | Fukuzumi et al. |
| 11,594,547 B2 | 2/2023 | Fukuzumi et al. |
| 2010/0207195 A1 | 8/2010 | Fukuzumi et al. |
| 2010/0320526 A1 | 12/2010 | Kidoh |
| 2012/0181602 A1 | 7/2012 | Fukuzumi et al. |
| 2014/0061750 A1 | 3/2014 | Kwon et al. |
| 2014/0241026 A1 | 8/2014 | Tanzawa |
| 2014/0284674 A1 | 9/2014 | Iwai |
| 2015/0062843 A1 | 3/2015 | Higashitsuji et al. |
| 2015/0129878 A1 | 5/2015 | Shin |
| 2015/0138862 A1 | 5/2015 | Park et al. |
| 2015/0340366 A1 | 11/2015 | Lim |
| 2016/0005781 A1 | 1/2016 | Lin |
| 2016/0079164 A1 | 3/2016 | Fukuzumi |
| 2016/0086967 A1 | 3/2016 | Lee |
| 2016/0233264 A1 | 8/2016 | Kagawa |
| 2016/0322376 A1 | 11/2016 | Lee |
| 2018/0261575 A1 | 9/2018 | Tagami |
| 2018/0374864 A1* | 12/2018 | Fukuzumi ............. H01L 21/185 |
| 2019/0043836 A1 | 2/2019 | Fastow |
| 2019/0043868 A1 | 2/2019 | Hasnat |
| 2019/0088589 A1 | 3/2019 | Zhu |
| 2019/0088676 A1 | 3/2019 | Tagami |
| 2019/0096900 A1 | 3/2019 | Matsuo |
| 2019/0221557 A1 | 7/2019 | Kim |
| 2019/0279952 A1 | 9/2019 | Tagami |
| 2020/0006371 A1 | 1/2020 | Huo |
| 2020/0058669 A1 | 2/2020 | Chen |
| 2020/0105735 A1 | 4/2020 | Park |
| 2020/0144242 A1 | 5/2020 | Park |
| 2020/0194452 A1 | 6/2020 | Xiao |
| 2020/0203328 A1 | 6/2020 | Park |
| 2020/0203329 A1 | 6/2020 | Kanamori |
| 2020/0203364 A1 | 6/2020 | Totoki |
| 2020/0227397 A1 | 7/2020 | Yada |
| 2020/0227398 A1 | 7/2020 | Oh |
| 2020/0243498 A1 | 7/2020 | Zhang |
| 2020/0243499 A1 | 7/2020 | Lee |
| 2020/0251149 A1 | 8/2020 | Zhang |
| 2020/0258817 A1 | 8/2020 | Okina |
| 2020/0258876 A1 | 8/2020 | Hosoda |
| 2020/0266146 A1 | 8/2020 | Nishida |
| 2020/0266182 A1 | 8/2020 | Nishikawa |
| 2020/0350286 A1* | 11/2020 | Cheng ................... H10D 62/83 |
| 2021/0005593 A1 | 1/2021 | Lee |
| 2021/0082880 A1 | 3/2021 | Sanuki et al. |
| 2021/0091001 A1 | 3/2021 | Suzuki et al. |
| 2022/0028829 A1* | 1/2022 | Cheng ................... H01L 24/80 |
| 2022/0285302 A1 | 9/2022 | Choi et al. |
| 2023/0138478 A1 | 5/2023 | Choi et al. |
| 2023/0282603 A1 | 9/2023 | Oh et al. |
| 2023/0403866 A1 | 12/2023 | Kim et al. |
| 2024/0155849 A1 | 5/2024 | Choi et al. |
| 2024/0334705 A1 | 10/2024 | Kang et al. |
| 2024/0339403 A1 | 10/2024 | Choi et al. |

FOREIGN PATENT DOCUMENTS

| | | |
|---|---|---|
| JP | 2011-54758 A | 3/2011 |
| JP | 2011-187794 A | 9/2011 |
| JP | 2011-204829 | 10/2011 |
| JP | 2012-146861 A | 8/2012 |
| JP | 2013-524550 A | 6/2013 |
| JP | 2014-11192 A | 1/2014 |

* cited by examiner

SEMICONDUCTOR MEMORY DEVICE HAVING A CIRCUIT CHIP BONDED TO A MEMORY ARRAY CHIP AND INCLUDING A SOLID-STATE DRIVE CONTROLLER AND A CONTROL CIRCUIT

CROSS-REFERENCE TO RELATED APPLICATIONS

This application is a continuation of and claims the benefit of priority under 35 U.S.C. § 120 from U.S. application Ser. No. 17/113,285 filed Dec. 7, 2020, which is a continuation of Ser. No. 16/409,637 filed May 10, 2019 (now U.S. Pat. No. 10,892,269 issued Jan. 12, 2021), which is a continuation-in-part U.S. application Ser. No. 16/121,123 filed Sep. 4, 2018, which is a continuation-in-part of U.S. application Ser. No. 15/388,318 filed Dec. 22, 2016 (now U.S. Pat. No. 10,090,315 issued Oct. 2, 2018), which is a continuation of U.S. application Ser. No. 14/806,034 filed Jul. 22, 2015 (now U.S. Pat. No. 9,558,945 issued Jan. 31, 2017), and claims the benefit of priority under U.S.C. § 119 from Japanese Patent Application No. 2014-186684 filed Sep. 12, 2014; the entire contents of each of which are incorporated herein by reference.

FIELD

Embodiments described herein relate generally to a semiconductor memory device.

BACKGROUND

A memory device having a three-dimensional structure has been proposed. In the memory device, a memory hole is formed in a stacked body including a plurality of electrode layers stacked via insulating layers. The electrode layers function as control gates in memory cells. A silicon body functioning as a channel is provided on the sidewall of the memory hole via a charge storage film.

In order to reduce a space factor of a control circuit of a three-dimensional memory array in a chip, there has also been proposed a technique for providing the control circuit right under the array. For example, a configuration is proposed in which bit lines are connected to transistors formed on a substrate, via contact plugs formed at an array end portion and a bit line extension layer provided on the lower side of a memory array.

Therefore, a fine interconnection layer equivalent to the bit lines is also necessary under the array. A region around the array is necessary in order to form a deep contact. Further, there is a concern about a problem in that, for example, the bit lines are substantially long, a bit line capacity increase, and operation speed is affected.

DETAILED DESCRIPTION

Figure 1:
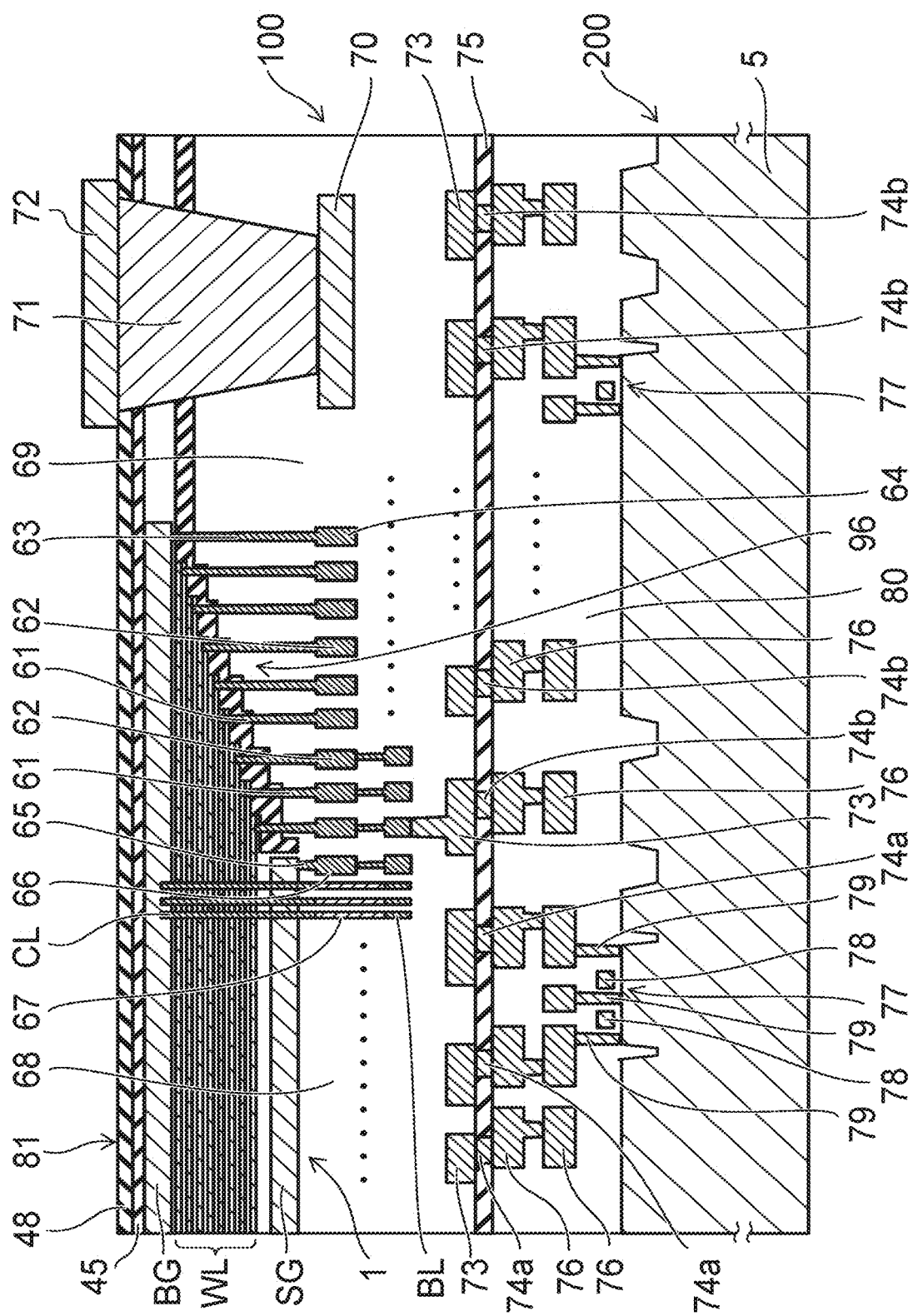
FIG. 1 is a schematic sectional view of a semiconductor memory device of a first embodiment.

According to one embodiment, a semiconductor memory device includes an array chip, a circuit chip, a bonding metal, a pad, and an external connection electrode. The array chip includes a three-dimensionally disposed plurality of memory cells and a memory-side interconnection layer connected to the memory cells. The array chip does not include a substrate. The circuit chip includes a substrate, a control circuit provided on the substrate, and a circuit-side interconnection layer provided on the control circuit and connected to the control circuit. The circuit chip is stuck to the array chip with the circuit-side interconnection layer facing to the memory-side interconnection layer. The bonding metal is provided between the memory-side interconnection layer and the circuit-side interconnection layer. The bonding metal is bonded to the memory-side interconnection layer and the circuit-side interconnection layer. The pad is provided in the array chip. The external connection electrode reaches the pad from a surface side of the array chip.

Embodiments are described below with reference to the drawings. Note that, in the figures, the same components are denoted by the same reference numerals and signs.

FIG. 1 is a schematic sectional view of a semiconductor memory device of a first embodiment.

The semiconductor memory device of the first embodiment has a structure in which an array chip 100 including a three-dimensionally disposed plurality of memory cells and a circuit chip 200 including a control circuit that controls writing, erasing, and readout of data for a memory cell are stuck together.

As described below, after an array wafer and a circuit wafer are stuck together wafer-to-wafer, a wafer bonded body is diced and singulated into chips.

First, the array chip 100 is described. The array chip 100 includes a memory cell array 1 of a three-dimensional structure.

Figure 3:
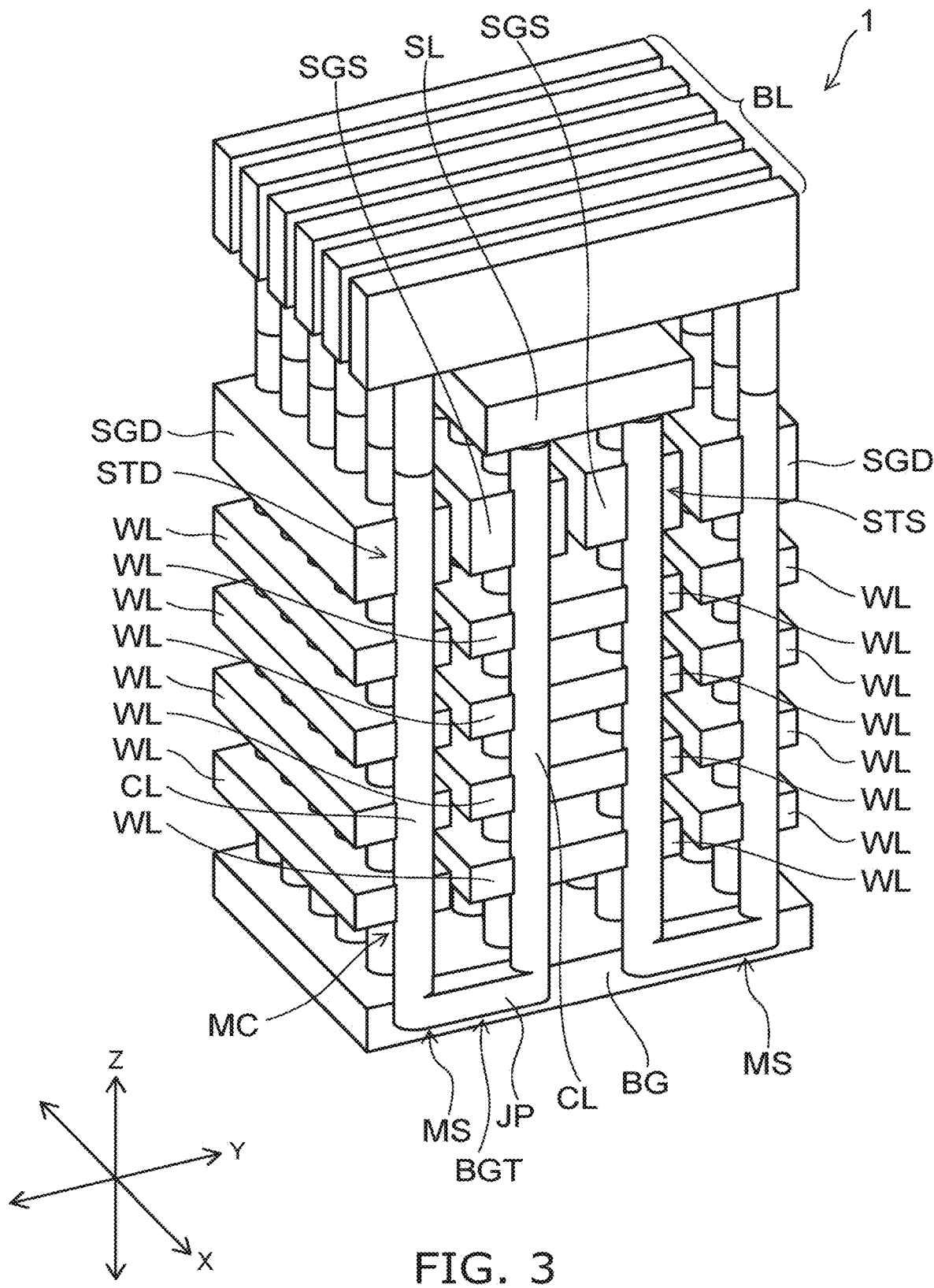
FIG. 3 is a schematic perspective view of a memory cell array of the first embodiment.

FIG. 3 is a schematic perspective view of the memory cell array 1. Note that, in FIG. 3, to clearly show the figure, an interlayer insulating layer, an insulating separation film, and the like are not shown.

In FIG. 3, two directions that are orthogonal to each other are represented as an X-direction and a Y-direction. A direction that is orthogonal to the X-direction and the Y-direction (an XY plane) and in which a plurality of layers of electrode layers WL are stacked is represented as Z-direction (a stacking direction).

Figure 4:
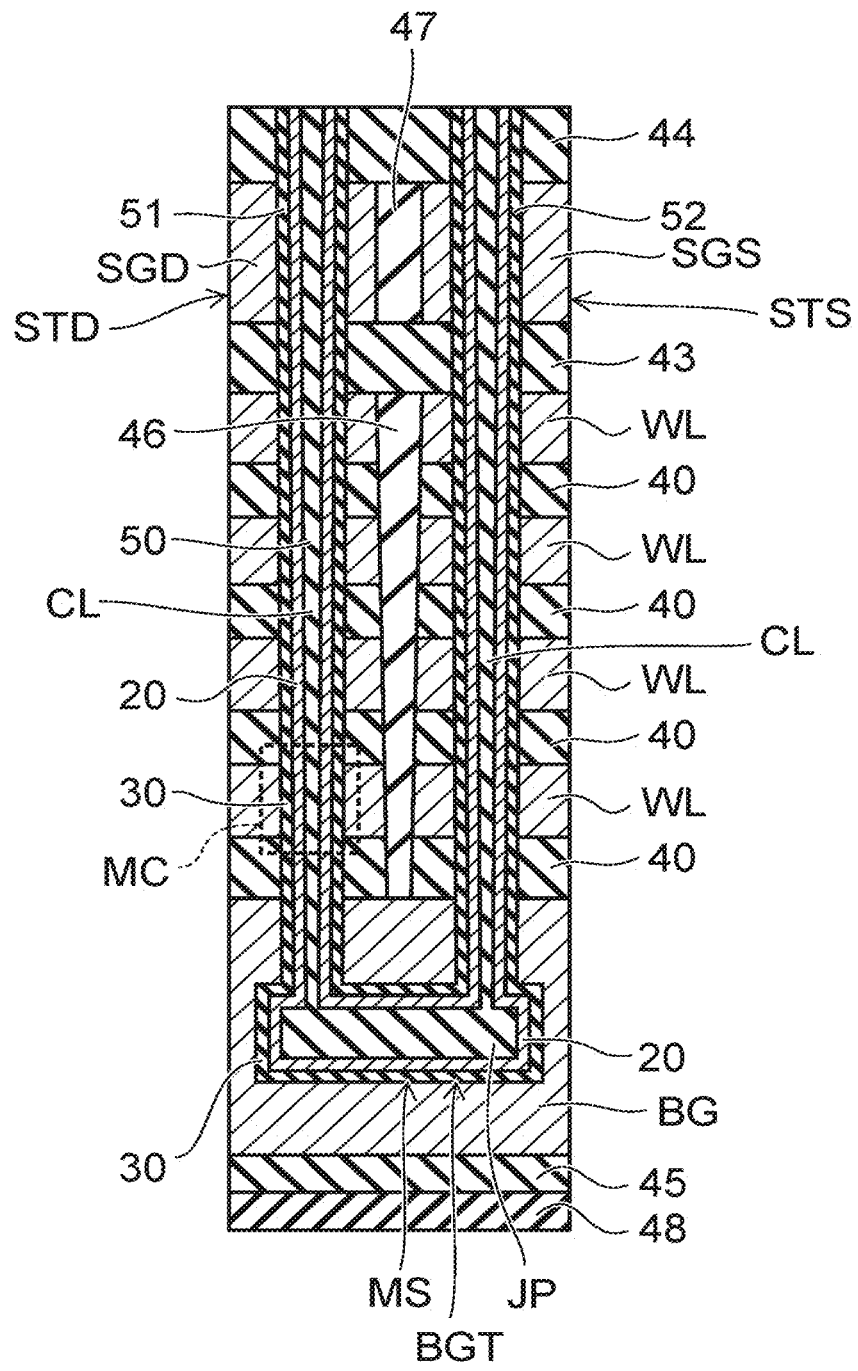
FIG. 4 is a schematic sectional view of a memory string of the first embodiment.

The memory cell array 1 includes a plurality of memory strings MS. FIG. 4 is a schematic sectional view of the memory string MS. FIG. 4 shows a cross section parallel to a YZ plane in FIG. 3.

The memory cell array 1 includes a stacked body including a plurality of electrode layers WL and a plurality of insulating layers 40. The electrode layers WL and the insulating layers 40 are alternately stacked. The stacked body is provided on a back gate BG functioning as a lower gate layer. Note that the number of layers of the electrode layers WL shown in the figure is an example. The number of layers of the electrode layers WL may be any number.

Figure 6:
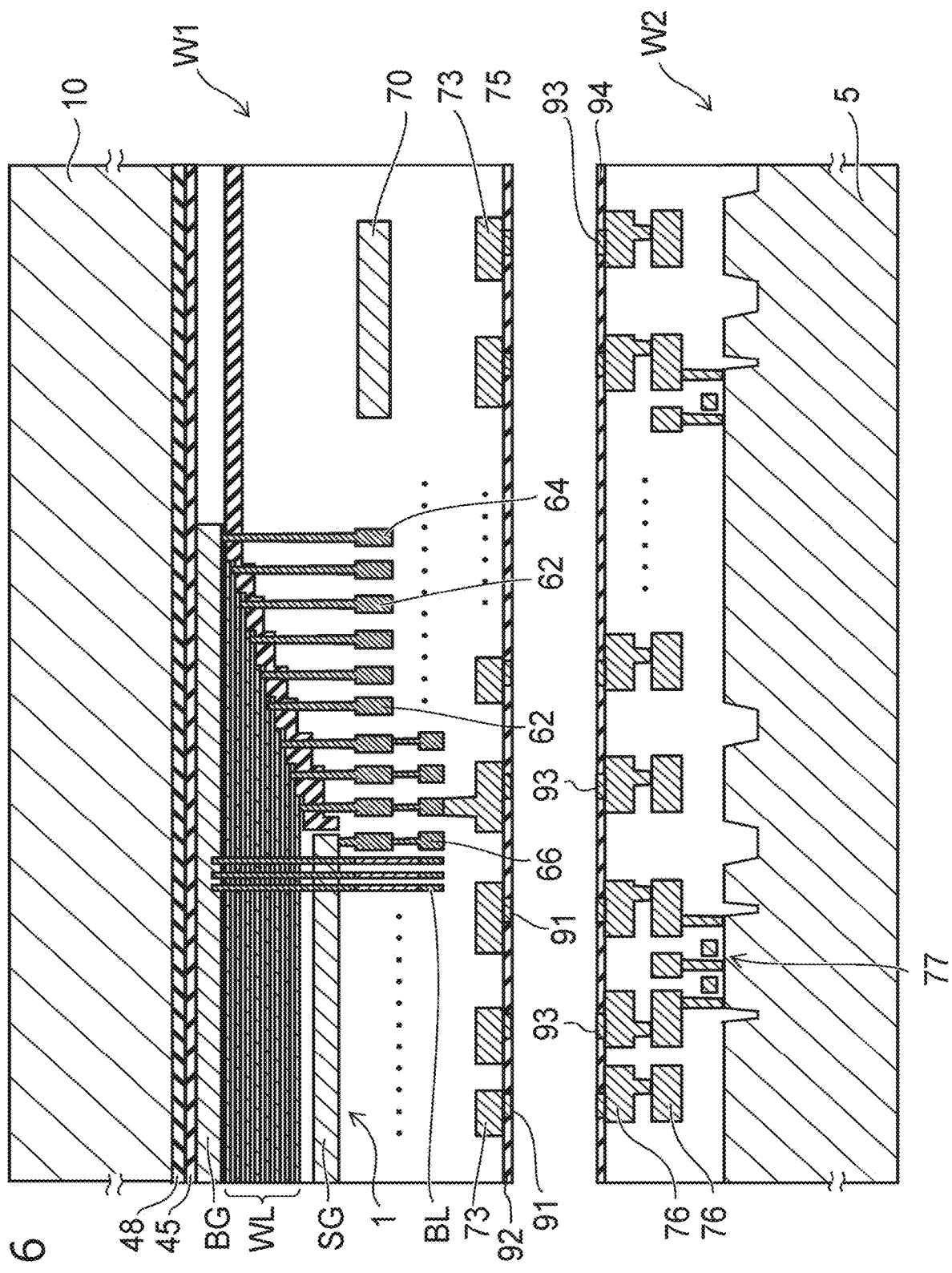
FIG. 6 and FIG. 7 are schematic sectional views showing a method for manufacturing the semiconductor memory device of the first embodiment.

As shown in FIG. 6 referred to below, the back gate BG is provided on a first substrate 10 via insulating films 48 and 45. After an array wafer W1 and a circuit wafer W2 are stuck together, the first substrate is removed.

The back gate BG and the electrode layers WL are layers containing silicon as a main component. Further, the back gate BG and the electrode layers WL contain, for example, boron as impurities for imparting conductivity to a silicon layer. The electrode layers WL may contain metal silicide. Alternatively, the electrode layers WL are metal layers.

The insulating layers 40 mainly contain, for example, silicon oxide. For example, the insulating film 48 is a silicon oxide film and the insulating film 45 is a silicon nitride film.

One memory string MS is formed in a U shape including a pair of a columnar sections CL extending in the Z-direction and a connecting section JP that couples respective lower ends of the pair of columnar sections CL. The columnar sections CL are formed in, for example, a columnar or elliptical columnar shape, pierce through the stacked body, and reach the back gate BG.

A drain-side select gate SGD is provided at an upper end portion of one of the pair of columnar sections CL in the U-shaped memory string MS. A source-side select gate SGS is provided at the other upper end portion. The drain-side select gate SGD and the source-side select gate SGS are provided on the electrode layer WL of the top layer via an interlayer insulating layer 43.

The drain-side select gate SGD and the source-side select gate SGS are layers containing silicon as a main component. Further, the drain-side select gate SGD and the source-side select gate SGS contain, for example, boron as impurities for imparting conductivity to a silicon layer.

The drain-side select gate SGD and the source-side select gate SGS functioning as an upper select gate and the back gate BG functioning as a lower select gate are thicker than one layer of the electrode layer WL.

The drain-side select gate SGD and the source-side select gate SGS are separated in the Y-direction by an insulating separation film 47. A stacked body under the drain-side select gate SGD and a stacked body under the source-side select gate SGS are separated in the Y-direction by an insulating separation film 46. That is, a stacked body between the pair of columnar sections CL of the memory string MS is separated in the Y-direction by the insulating separation films 46 and 47.

On the source-side select gate SGS, a source line (e.g., a metal film) SL is provided via an insulating layer 44. A plurality of bit lines (e.g., metal films) BL shown in FIG. 1 are provided on the drain-side select gate SGD and the source line SL via the insulating layer 44. The bit lines BL extend in the Y-direction.

Figure 5:
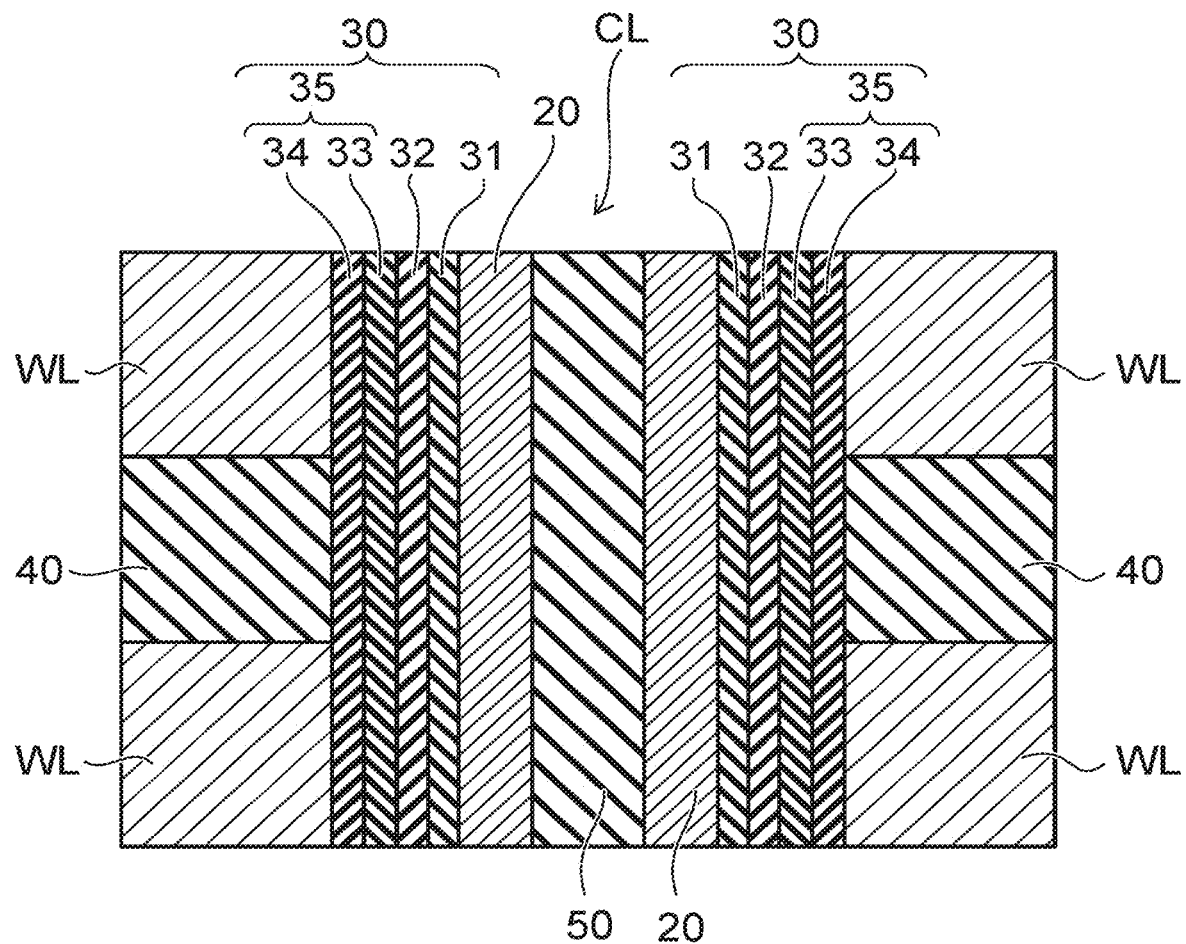
FIG. 5 is a schematic sectional view of a memory cell of the first embodiment.

FIG. 5 is an enlarged schematic sectional view of a part of the columnar section CL.

The columnar section CL is formed in a U-shaped memory hole formed in the stacked body including the plurality of layers of the electrode layers WL, the plurality of layers of the insulating layers 40, and the back gate BG. In the memory hole, a channel body 20 functioning as a semiconductor body is provided. The channel body 20 is, for example, a silicon film. The impurity concentration of the channel body 20 is lower than the impurity concentration of the electrode layers WL.

A memory film 30 is provided between the inner wall of the memory hole and the channel body 20. The memory film 30 includes a block insulating film 35, a charge storage film 32, and a tunnel insulating film 31.

The block insulating film 35, the charge storage film 32, and the tunnel insulating film 31 are provided in order from the electrode layers WL side between the electrode layers WL and the channel body 20.

The channel body 20 is provided in a cylindrical shape extending in the stacking direction of the stacked body. The memory film 30 is provided in a cylindrical shape to surround the outer circumferential surface of the channel body 20 while extending in the stacking direction of the stacked body. The electrode layers WL surround the channel body 20 via the memory film 30. A core insulating film 50 is provided on the inner side of the channel body 20. The core insulating film 50 is, for example, a silicon oxide film.

The block insulating film 35 is in contact with the electrode layers WL. The tunnel insulating film 31 is in contact with the channel body 20. The charge storage film 32 is provided between the block insulating film 35 and the tunnel insulating film 31.

The channel body 20 functions as a channel in memory cells MC. The electrode layers WL function as control gates of the memory cells. The charge storage film 32 functions as a data memory layer that accumulates charges injected from the channel body 20. That is, the memory cells MC having a structure in which the control gates surround the channel are formed in crossing portions of the channel body 20 and the electrode layers WL.

The semiconductor memory device of the first embodiment is a nonvolatile semiconductor memory device that can electrically freely perform erasing and writing of data and can retain stored content even if a power supply is turned off.

The memory cell MC is, for example, a memory cell of a charge trap type. The charge storage film 32 includes a large number of trap sites that trap charges. The charge storage film 32 is, for example, a silicon nitride film.

The tunnel insulating film 31 functions as a potential barrier when charges are injected into the charge storage film 32 from the channel body 20 or when charges stored in the charge storage film 32 diffuse to the channel body 20. The tunnel insulating film 31 is, for example, a silicon oxide film.

Alternatively, as the tunnel insulating film, a stacked film (an ONO film) having a structure in which a silicon nitride film is sandwiched by a pair of silicon oxide films may be used. When the ONO film is used as the tunnel insulating film, compared with a single layer of a silicon oxide film, an erasing operation can be performed in a low electric field.

The block insulating film 35 prevents the charges stored in the charge storage film 32 from diffusing to the electrode layers WL. The block insulating film 35 includes a cap film 34 provided in contact with the electrode layers WL and a block film 33 provided between the cap film 34 and the charge storage film 32.

The block film 33 is, for example, a silicon oxide film. The cap film 34 is a film having a dielectric constant higher than the dielectric constant of silicon oxide and is, for example, a silicon nitride film. By providing such a cap film 34 in contact with the electrode layers WL, it is possible to suppress back tunnel electrons injected from the electrode layers WL during erasing. That is, by using a stacked film of the silicon oxide film and the silicon nitride film as the block insulating film 35, it is possible to improve a charge blocking property.

As shown in FIGS. 3 and 4, a drain-side select transistor STD is provided at the upper end portion of one of the pair of columnar sections CL in the U-shaped memory string MS. A source-side select transistor STS is provided at the other upper end portion.

The memory cell MC, the drain-side select transistor STD, and the source-side select transistor STS are vertical transistors in which an electric current flows in the stacking direction of the stacked body (the Z-direction).

The drain-side select gate SGD functions as a gate electrode (a control gate) of the drain-side select transistor STD. An insulating film 51 (FIG. 4) functioning as a gate insulating film of the drain-side select transistor STD is provided between the drain-side select gate SGD and the channel body 20. The channel body 20 of the drain-side select transistor STD is connected to the bit line BL above the drain-side select gate SGD.

The source-side select gate SGS functions as a gate electrode (a control gate) of the source-side select transistor STS. An insulating film 52 (FIG. 4) functioning as a gate insulating film of the source-side select transistor STS is provided between the source-side select gate SGS and the channel body 20. The channel body 20 of the source-side select transistor STS is connected to the source line SL above the source-side select gate SGS.

A back gate transistor BGT is provided in the connecting section JP of the memory string MS. The back gate BG functions as a gate electrode (a control gate) of the back gate transistor BGT. The memory film 30 provided in the back gate BG functions as a gate insulating film of the back gate transistor BGT.

A plurality of memory cells MC including the electrode layers WL of the respective layers as control gates are provided between the drain-side select transistor STD and the back gate transistor BGT. Similarly, a plurality of memory cells MC including the electrode layers WL of the respective layers as control gates are also provided between the back gate transistor BGT and the source-side select transistor STS.

The plurality of memory cells MC, the drain-side select transistor STD, the back gate transistor BGT, and the source-side select transistor STS are connected in series through the channel body 20 and configures U-shaped one memory string MS. The plurality of memory strings MS are arrayed in the X-direction and the Y-direction, whereby the plurality of memory cells MC are three-dimensionally provided in the X-direction, the Y-direction, and the Z-direction.

The electrode layers WL are separated into a plurality of blocks in the Y-direction and extend in the X-direction.

In FIG. 1, a region at the end in the X-direction in the memory cell array 1 is shown. A step structure section 96 of the electrode layers WL is formed at an end of a memory cell array region 81 where the plurality of memory cells MC are disposed.

In the step structure section 96, the end portions in the X-direction of the electrode layers WL of the respective layers are formed in a step shape. In the step structure section 96, a plurality of contact plugs 61 connected to the electrode layers WL of the respective layers formed in the step shape are provided. The contact plugs 61 are connected to the electrode layers WL of the respective layers in the step shape piercing through an interlayer insulating layer 69.

In the step structure section 96, the back gate BG is connected to a contact plug 63. A select gate SG (the drain-side select gate SGD and the source-side select gate SGS) is connected to a contact plug 65.

The contact plugs 61 connected to the electrode layers WL are connected to word interconnection layers 62. The contact plug 63 connected to the back gate BG is connected to a back gate interconnection layer 64. The contact plug 65 connected to the select gate SG is connected to a select gate interconnection layer 66.

The word interconnection layers 62, the back gate interconnection layer 64, and the select gate interconnection layer 66 are provided in the same layer. The source line SL shown in FIG. 3 is also provided in the same layer as the word interconnection layers 62, the back gate interconnection layer 64, and the select gate interconnection layer 66.

The word interconnection layers 62, the back gate interconnection layer 64, the select gate interconnection layer 66, and the source line SL are formed by patterning of the same material layer (e.g., metal layer). Therefore, the word interconnection layers 62, the back gate interconnection layer 64, the select gate interconnection layer 66, and the source line SL are simultaneously formed in the same layer formed of the same material and at the same thickness.

The word interconnection layers 62 are further connected to surface layer interconnection layers 73, which are formed on the side of a bonding surface to the circuit chip 200 of the array chip 100, via other plugs and interconnection layers.

The back gate interconnection layer 64, the select gate interconnection layer 66, and the source line SL are also connected to the surface layer interconnection layers 73 via other plugs and interconnection layers.

The channel bodies 20 of the columnar sections CL and the bit lines BL are connected via plugs 67. Further, the bit lines BL are connected to the surface layer interconnection layers 73 via other plugs and interconnection layers.

The array chip 100 includes a memory-side interconnection layer for electrically connecting the memory cell array 1 to the circuit chip 200. The memory-side interconnection layer is formed as a multilayer interconnect including the word interconnection layers 62, the back gate interconnection layer 64, the select gate interconnection layer 66, and the surface layer interconnection layers 73.

The surface layer interconnection layers 73 are connected to circuit-side interconnection layers 76 of the circuit chip 200 via bonding metals 74a and 74b. The circuit chip 200 includes a substrate 5. The substrate 5 is, for example, a silicon substrate.

A control circuit is formed on a circuit formation surface (a surface facing the array chip 100 side) of the substrate 5. The control circuit is formed as a semiconductor integrated circuit including a transistor 77. The transistor 77 has a Metal-Oxide-Semiconductor Field Effect Transistor (MOSFET) structure including, for example, a gate electrode 78 and source/drain regions. The source/drain regions of the MOSFET are connected to the circuit-side interconnection layers 76 via plugs 79.

The circuit-side interconnection layers 76 are formed on the circuit formation surface as multilayer interconnects via an interlayer insulating film 80.

The bonding metals 74a and 74b are provided between the surface layer interconnection layers 73 of the array chip 100 and interconnection layers of uppermost layers (interconnection layers of top layers viewed from the substrate 5) of the circuit-side interconnection layers 76 of the circuit chip 200. The bonding metals 74a and 74b are, for example, copper or a copper alloy containing copper as a main component.

The surface layer interconnection layers 73 of the array chip 100 and the circuit-side interconnection layers 76 of the top layer of the circuit chip 200 are bonded to the bonding metals 74a and 74b. An insulating film 75 is provided around the bonding metals 74a and 74b between the array chip 100 and the circuit chip 200. The insulating film 75 is a resin film or an inorganic film.

The array chip 100 and the circuit chip 200 are stuck together via the bonding metals 74a and 74b and the insulating film 75. The memory-side interconnection layer of the array chip 100 and the circuit-side interconnection layers 76 of the circuit chip 200 are electrically connected via the bonding metals 74a and 74b.

Therefore, the memory cell array 1 is connected to the control circuit of the circuit chip 200 via the memory-side interconnection layer, the bonding metals 74a and 74b, and the circuit-side interconnection layers 76.

According to the first embodiment, an external connection electrode 71 is formed on the array chip 100 side. A pad 70 is provided in a region closer to an end than the step structure section 96 in the array chip 100.

For example, the pad 70 is formed by patterning of a metal layer (e.g., a tungsten layer) in forming the word interconnection layers 62, the back gate interconnection layer 64, the select gate interconnection layer 66, and the source line SL. Therefore, the pad 70 is formed in the same layer and formed of the same material and at the same thickness as the word interconnection layers 62, the back gate interconnection layer 64, the select gate interconnection layer 66, and the source line SL.

An external connection pad 72 is provided on the surface (the surface on the opposite side of the bonding surface to the circuit chip 200) of the array chip 100. The external connection electrode 71 is provided between the external connection pad 72 and the pad 70.

The pad 70 is electrically connected to the circuit-side interconnection layers 76 via the memory-side interconnection layer or separately-provided vias. Therefore, the control circuit formed in the circuit chip 200 is electrically connected to the external connection pad 72 via the pad 70 and the external connection electrode 71. The external connection pad 72 is connectable to a mounting substrate or other chips via, for example, a solder ball, a metal bump, or a bonding wire.

A plurality of the bonding metals 74a and 74b are disposed in a bonding section of the array chip 100 and the circuit chip 200. The plurality of bonding metals 74a and 74b mainly include a plurality of bit-line lead-out sections 74a electrically connected to the bit lines BL and a plurality of word-line lead-out sections 74b electrically connected to the electrode layers WL.

Figure 2:
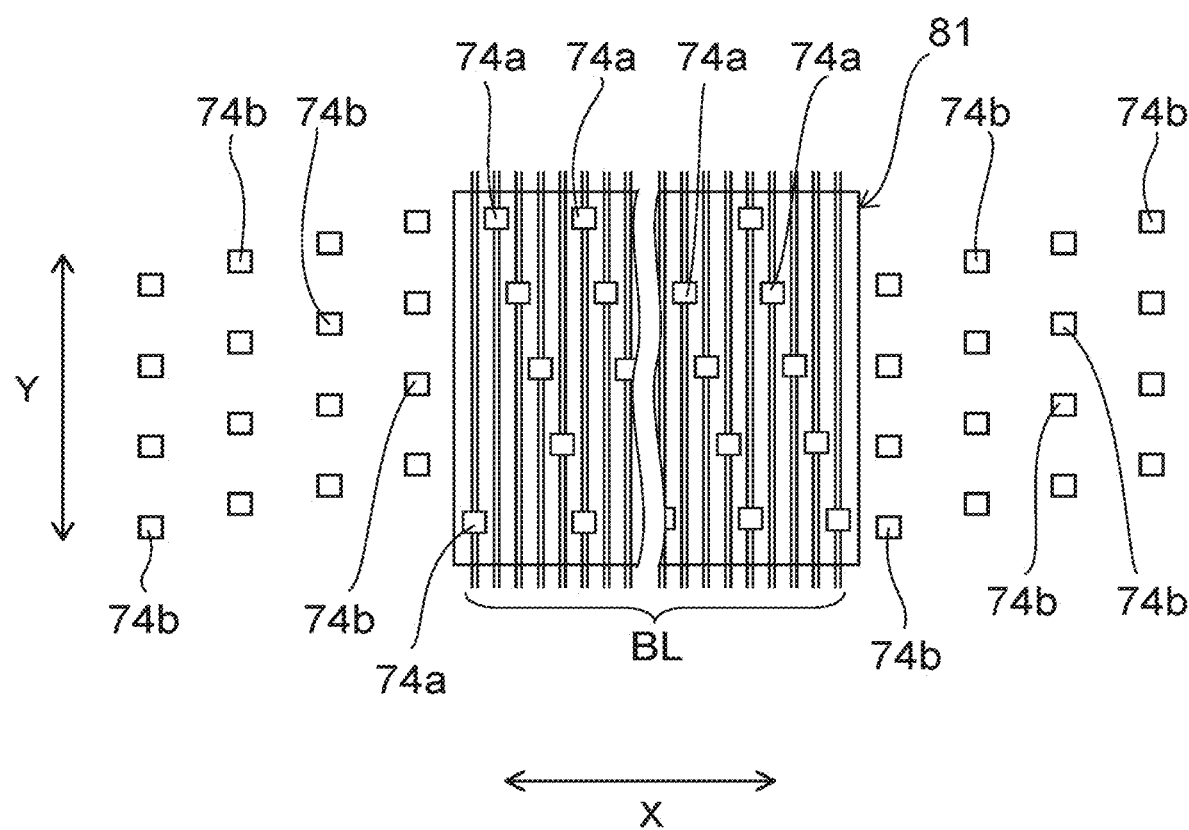
FIG. 2 is a schematic plan view showing an example of a layout of a bonding metal of the semiconductor memory device of the first embodiment.

FIG. 2 is a schematic plan view showing a disposition relation of the bit-line lead-out sections 74a and the word-line lead-out sections 74b.

The bit-line lead-out sections 74a are disposed in a region overlapping, in the stacking direction, a memory cell array region 81 where the plurality of memory strings MS are disposed (a region below the memory cell array region 81 in FIG. 1).

The word-line lead-out sections 74b are disposed in a region overlapping, in the stacking direction, a region where the step structure section 96, the external connection electrode 71, and the like are formed further on the outer side than the memory cell array region 81. In FIG. 1, the plurality of word-line lead-out sections 74b are disposed in a region below the step structure section 96 and a region below the external connection electrode 71 (the pad 70).

Figure 7:
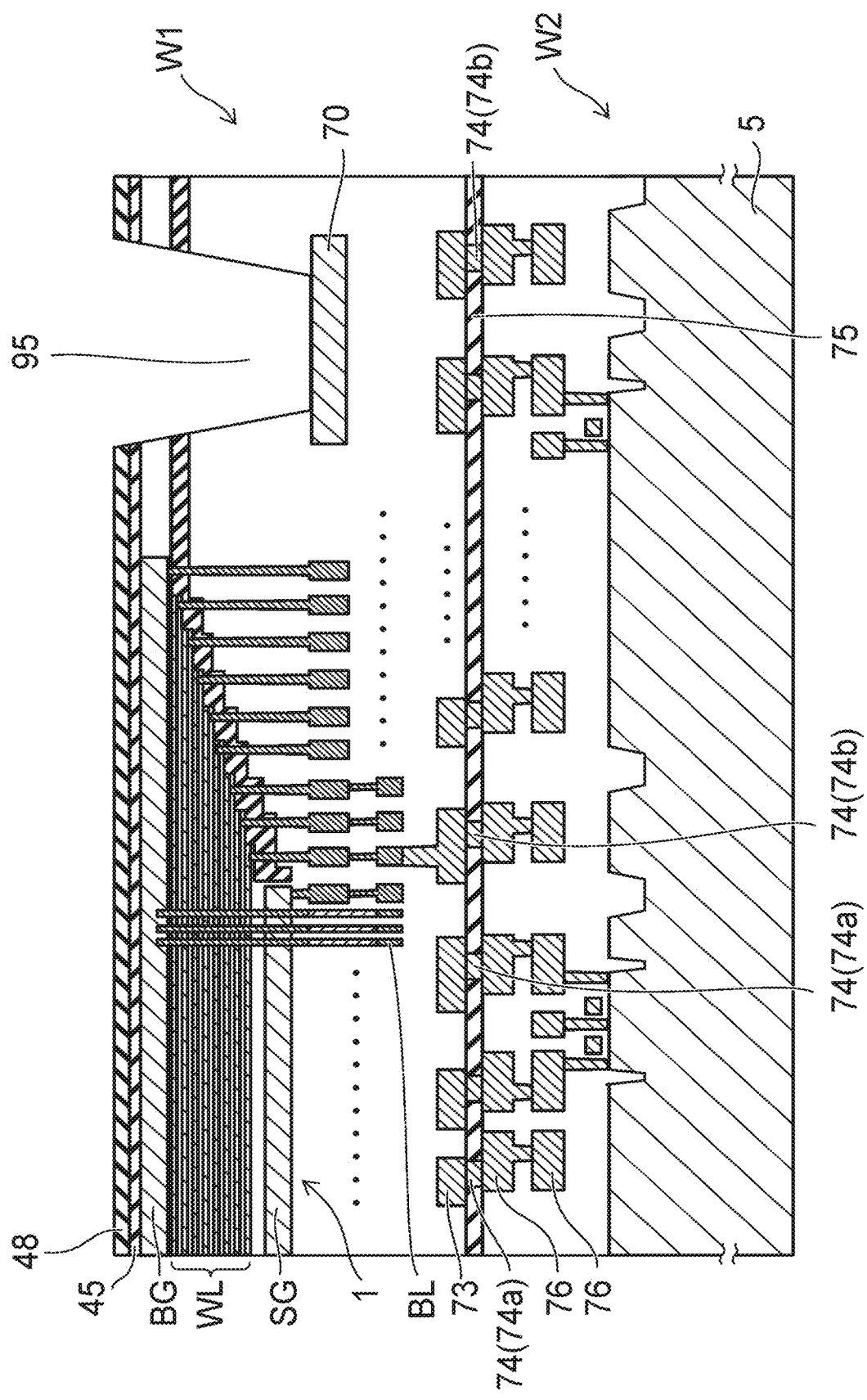

A method for manufacturing the semiconductor memory device of the first embodiment is described with reference to FIGS. 6 and 7.

Components of the array chip 100 and components of the circuit chip 200 are respectively formed in wafer states.

In FIG. 6, the array wafer W1 and the circuit wafer W2 before being stuck together are shown.

The substrate 10 still remains on the array wafer W1 before being stuck. The back gate BG is formed on the substrate (e.g., a silicon substrate) 10 via the silicon oxide film 48 and the silicon nitride film 45. Further, the stacked body including the plurality of layers of the electrode layers WL and the select gate SG are stacked on the back gate BG.

After the stacked body is formed, the memory strings MS, the step structure section 96, and the like are formed. Further, the memory-side interconnection layer is formed. The pad 70 is also formed during the formation of the memory-side interconnection layer.

After the surface layer interconnection layers 73 of the memory-side interconnection layer is formed, first bonding metals 91 and a first insulating film 92 are formed on a bonding surface (the surface on the opposite side of the substrate 10) of the array wafer W1. The first bonding metals 91 are bonded to the surface layer interconnection layers 73. The first insulating film 92 is formed between the first bonding metal 91 and the first bonding metal 91 (around the first bonding metals 91). The surfaces (bonding surfaces) of the first bonding metals 91 are exposed from the first insulating film 92.

Components of the circuit wafer W2 are formed on the substrate (e.g., a silicon substrate) 5 different from the substrate of the array wafer W1.

After the control circuit (the semiconductor integrated circuit) including the transistor 77 is formed on the surface of the substrate 5, the circuit-side interconnection layers 76 are formed via the interlayer insulating layer 80.

Second bonding metals 93 and a second insulating film 94 are formed on a bonding surface (the surface on the opposite side of the substrate 5) of the circuit wafer W2. The second bonding metals 93 are bonded to the circuit interconnection layers 76 of the top layers. The second insulating film 94 is formed between the second bonding metal 93 and the second bonding metal 93 (around the second bonding metals 93). The surfaces (bonding surfaces) of the second bonding metals 93 are exposed from the second insulating film 94.

The array wafer W1 and the circuit wafer W2 are bonded wafer-to-wafer by applying mechanical pressure with the surfaces on the opposite sides of the substrates 10 and 5 facing to each other.

The first bonding metals 91 and the second bonding metals 93 are, for example, copper or a copper alloy. The first bonding metals 91 and the second bonding metals 93 are bonded to each other to be integral bonded metals 74 as shown in FIG. 7. The first insulating film 92 and the second insulating film 94 are bonded to be an integral insulating film 75.

After the array wafer W1 and the circuit wafer W2 are stuck together, the substrate 10 of the array wafer W1 is removed. For example, the entire substrate 10 is removed by wet etching using nitrohydrofluoric acid.

On a surface from which the substrate 10 is removed, the insulating films (the silicon oxide film 48 and the silicon nitride film 45) formed on the substrate 10 remain as a passivation film that protects the surface of the array wafer W1 (the array chip 100).

After the substrate 10 is removed, a via 95 reaching the pad 70 is formed from the side of the surface from which the substrate 10 is removed (the surface of the silicon oxide film 48).

In the via 95, as shown in FIG. 1, the external connection electrode 71 is embedded.

Alternatively, the external connection electrode 71 may be formed on the bottom section of the via 95 (the upper surface of the pad 70) and the sidewall of the via 95 while leaving a space in the via 95.

For driving of the memory cell array 1, a high voltage of, for example, approximately 20 V is sometimes required. In order to maintain a breakdown voltage of the transistor 77 of the control circuit (a CMOS circuit) (in order to extend a depletion layer), it is desired to leave, on the circuit chip 200 side, the substrate (the silicon substrate) 5 having thickness of approximately 10 to 20 μm. The thick substrate 5 functions as a support body for the semiconductor memory device.

In connecting the control circuit to an external circuit, it is conceivable to form Through Silicon Vias (TSVs), which pierce through the substrate 5, from the rear surface side of the substrate and connect the TSVs to the circuit-side interconnection layers 76. However, costs and a treatment time for etching of the thick substrate 5 are large. Further, in order to prevent a short circuit of the silicon substrate 5 and intra-via electrodes, a process for forming insulating films on via sidewalls is also necessary.

On the other hand, according to the first embodiment, the via 95 (FIG. 7) is formed on the side of the array chip 100 from which the substrate 10 is removed. Since the thickness of the array chip 100 is approximately several micrometers, a deep etching process for piercing through a thick substrate of several tens micrometers is unnecessary. It is possible to attain a reduction in costs.

By removing the substrate 10 of the array wafer W1 with wet etching, stress applied to the memory cell array 1 is not generated unlike substrate removal by grinding. Therefore, yield and reliability are improved.

A method for forming a control circuit on a substrate and forming a memory cell array on the control circuit is also conceivable. However, in some case, a heat process of 900° C. or higher is necessary for the formation of the three-dimensional memory cell array 1. If the control circuit is formed under the cell array in advance, there is a concern about problems such as diffusion of impurities of a transistor and heat resistance of a metal contact.

Further, according to an increase in speed of an interface in future, improvement of the performance of the transistor is desired. It is also likely that it is necessary to form the control circuit using a process with low heat resistance in which salicide or the like is used.

On the other hand, according to the first embodiment, since the array chip 100 including the memory cell array 1 and the circuit chip 200 including the control circuit are formed by separate wafer processes, high heat treatment for the memory cell array 1 does not act on the control circuit. Therefore, it is possible to form both of the memory cell array 1 and the control circuit in structures with high reliability.

In a structure in which a control circuit and a memory cell array are sequentially formed on a substrate, bit lines are formed further on the upper side than a stacked body when viewed from the substrate. Therefore, in connecting the bit lines to the control circuit, after the bit lines are led out to an outer side region of a memory cell array region via an interconnection layer formed on the bit lines, deep contact plugs are connected to the control circuit on the substrate surface from the lead-out interconnection layer. This could be a cause of an increase in a chip area because of a region for routing of interconnects. There is also a concern that the bit lines are substantially long, a bit line capacity increases, and operation speed is affected. There is the same concern about routing of electrode layers (word lines).

On the other hand, according to the first embodiment, the side where the bit lines BL, the source line SL, the word interconnection layers 62, and the like are formed is bonded to the circuit chip 200 via the bonding metals 74a and 74b. Therefore, interconnects only have to be directly led out downward (toward the bonding surface side).

For example, as described with reference to FIG. 2, the bit-line lead-out sections 74a are not led out to (not disposed on) the outer side of the memory cell array region 81 and are disposed in the overlapping region below the memory cell array region 81.

Therefore, it is possible to suppress an increase in a interconnection length and an interconnect formation region for connecting the bit lines BL, the source line SL, the word interconnection layers 62, and the like to the control circuit and suppress an operation delay and an increase in a chip area.

As described above, according to the first embodiment, it is possible to attain an increase in the capacity of the memory cells and improvement of reliability with an inexpensive process. Further, it is possible to realize refining and an increase in speed of the control circuit.

Figure 8:
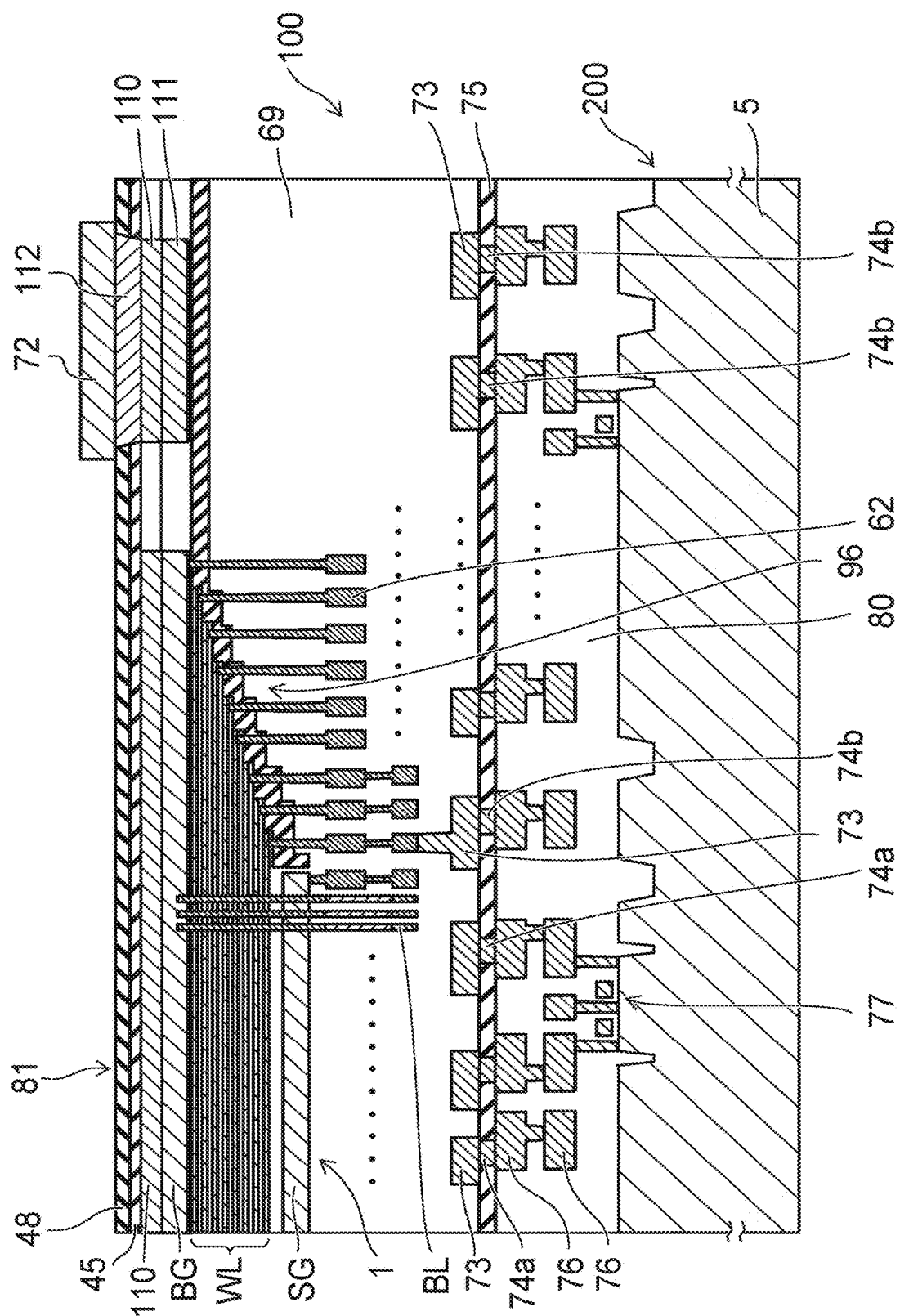
FIG. 8 is a schematic sectional view of the semiconductor memory device of the first embodiment.

The pad connected to the external connection electrode may be formed in the same layer as the back gate BG as shown in FIG. 8.

Polycrystalline silicon is often used in the back gate BG. Therefore, in order to reduce the resistance of the pad, it is desired to stack a layer 110 containing metal such as a metal silicide layer or a metal layer on the back gate BG.

The layer 110 containing the metal is formed on the substrate 10 via the insulating films 48 and 45 in a wafer stage. The back gate BG is formed on the layer 110. The layer 110 containing the metal and the back gate BG are left as pads 110 and 111 in a region further on the outer side than the step structure section 96 by patterning.

After the substrate 10 is removed, a via reaching the pad 110 is formed from the surface side of the array wafer W1. An external connection electrode 112 is formed in the via.

Compared with the structure shown in FIG. 1 in which the pad is formed in the same layer as the word interconnection layer 62 and the like, the via may be shallow. It is possible to realize a further reduction in costs and further improvement of yield.

Figure 9:
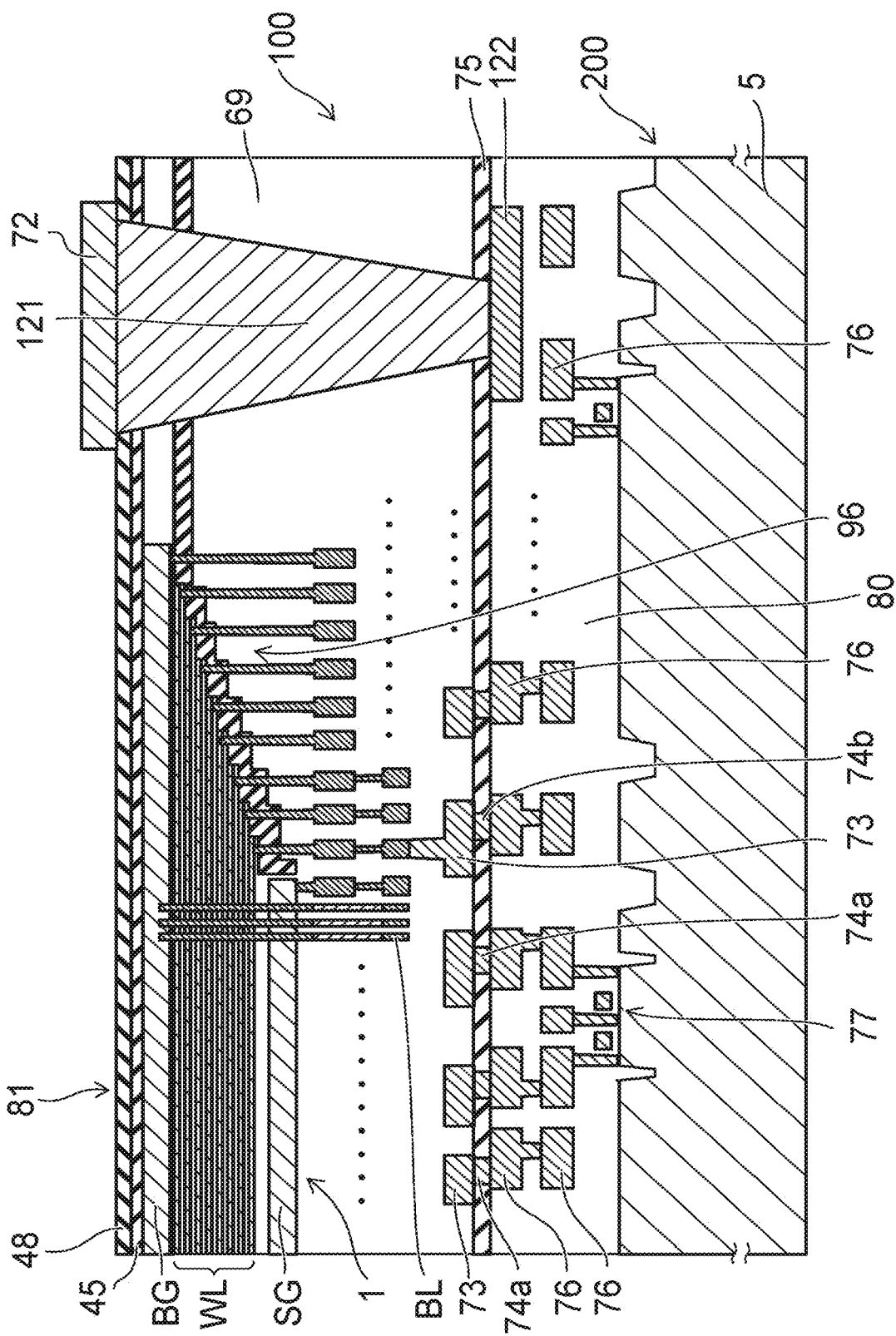
FIG. 9 is a schematic sectional view of the semiconductor memory device of the first embodiment.

The pad is not limited to be formed in the array chip 100. As shown in FIG. 9, a part of the circuit-side interconnection layer 76 of the circuit chip 200 may be used as a pad 122. For example, a interconnection layer of a top layer of the circuit-side interconnection layer 76 viewed from the substrate 5 is formed as the pad 122.

After the substrate 10 of the array wafer W1 is removed, a via reaching the pad 122 is formed from the surface side of the array wafer W1 in a region further on the outer side than the step structure section 96. An external connection electrode 121 is formed in the via. The external connection electrode 121 is connected to the circuit-side interconnection layer 76 not via the memory-side interconnection layer.

Figure 10:
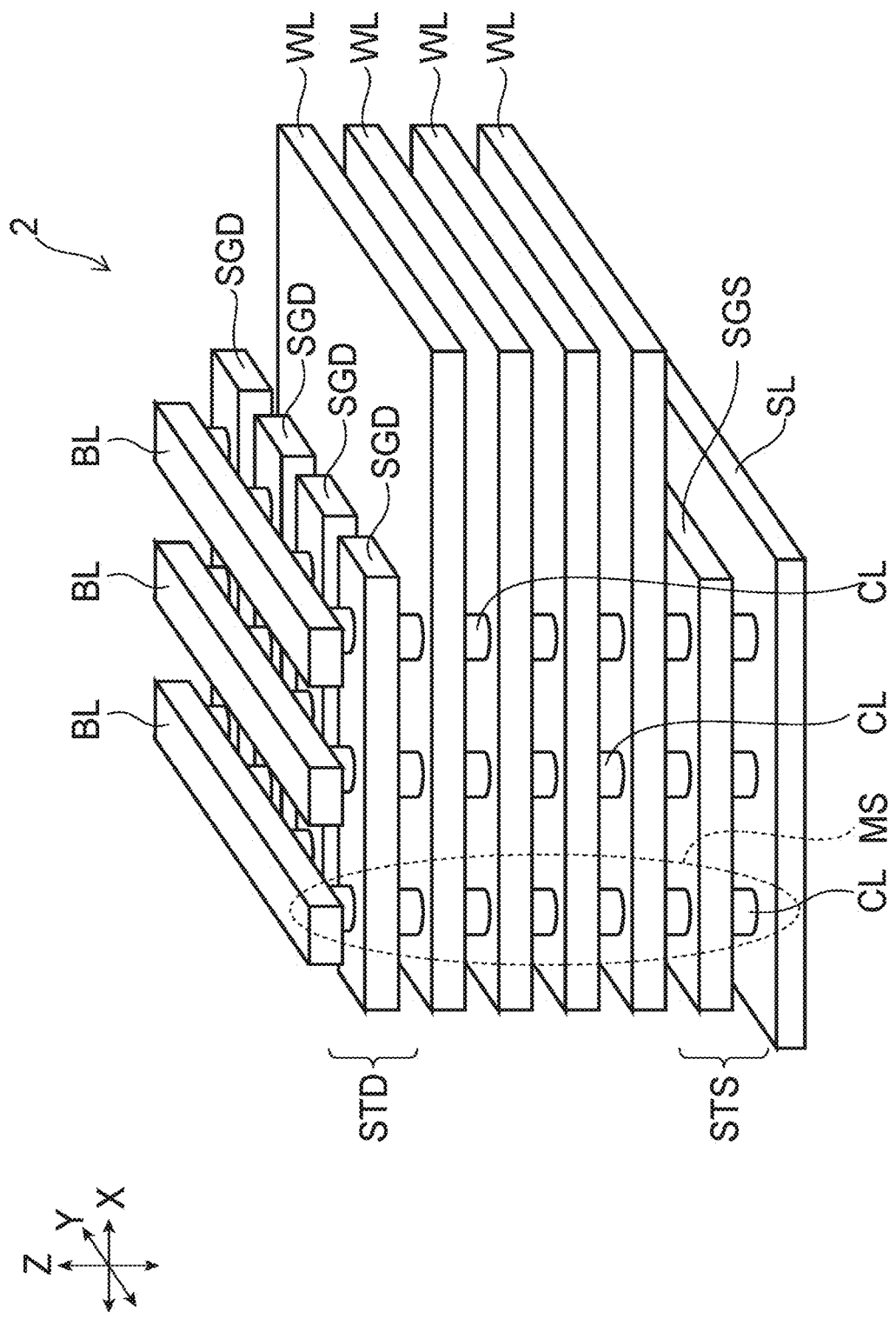
FIG. 10 is a schematic perspective view of a memory cell array of the first embodiment.

FIG. 10 is a schematic perspective view of a memory cell array 2 of another example of the semiconductor memory device of the first embodiment. Note that, in FIG. 10, as in FIG. 3, to clearly show the figure, insulating layers and the like are not shown.

The source layer SL is provided on the opposite side of the bonding surface to the circuit chip 200. The source-side select gate (the lower select gate layer) SGS is provided on the source layer SL via an insulating layer.

An insulating layer is provided on the source-side select gate SGS. A stacked body obtained by alternately stacking the plurality of electrode layers WL and a plurality of insulating layers is provided on the insulating layer.

An insulating layer is provided on the electrode layer WL of a most distant layer when viewed from the source layer SL. The drain-side select gate (the upper select gate layer) SGD is provided on the insulating layer.

The columnar sections CL extending in the Z-direction are provided in the stacked body. That is, the columnar sections CL pierce through the drain-side select gate SGD, the plurality of layers of the electrode layers WL, and the source-side select gate SGS. One end of the channel body 20 in the columnar section CL is connected to the bit line BL. The other end of the channel body is connected to the source line SL.

The source line SL is formed on the substrate. The source-side select gate SGS, the stacked body including the plurality of layers of the electrode layers WL, the drain-side select gate SGD, and the bit lines BL are formed in order on the source line SL. An array wafer in which the source line SL, the source-side select gate SGS, the stacked body including the plurality of layers of the electrode layers WL, the drain-side select gate SGD, and the bit lines BL is stuck to the circuit wafer W2 with the bit lines BL side opposed to the circuit wafer W2.

After the sticking, the substrate is removed. A via is formed from a surface side from which the substrate is removed. An external connection electrode is formed in the via.

Figure 11:
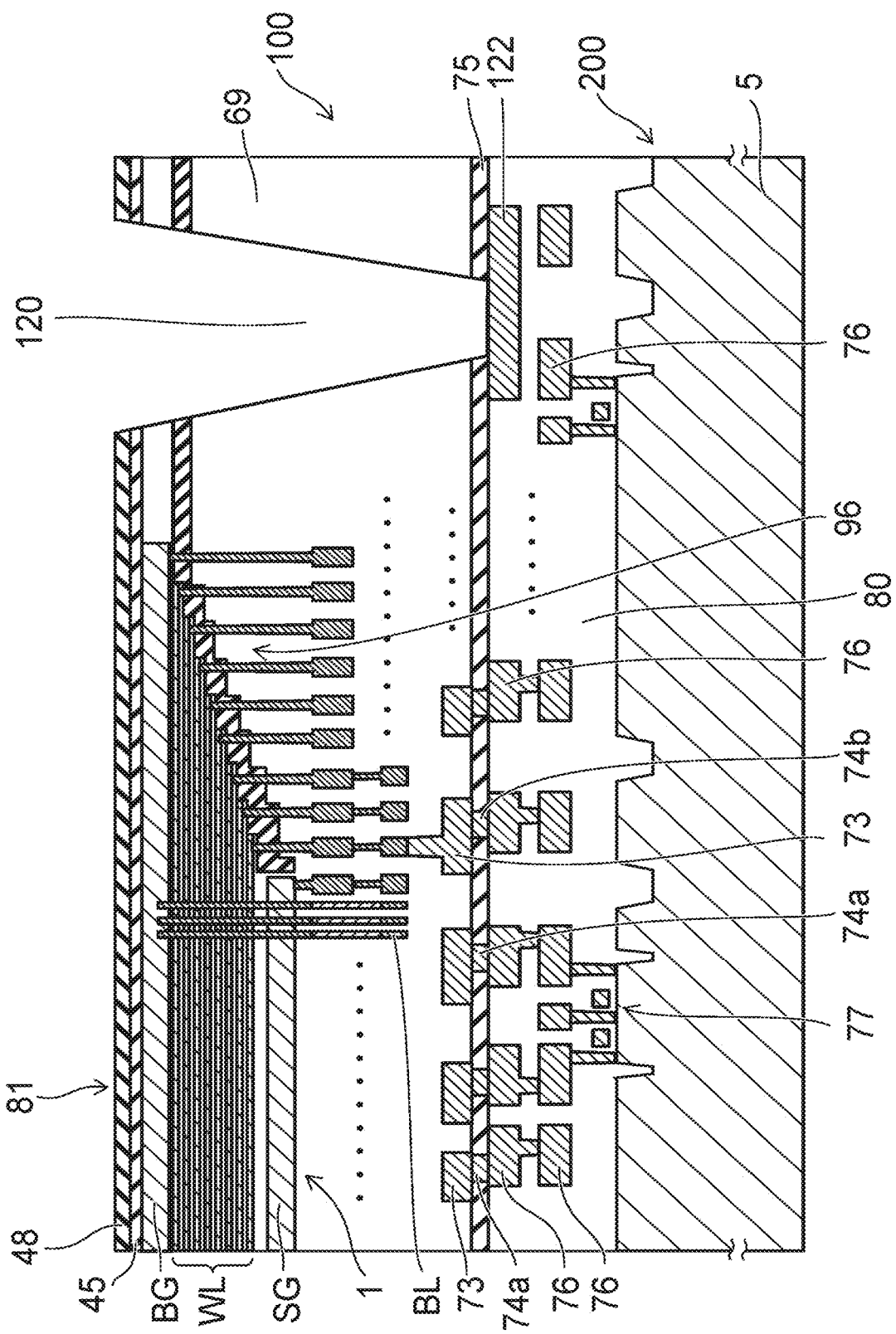
FIG. 11 is a schematic sectional view of the semiconductor memory device of the first embodiment.

FIG. 11 is a schematic sectional view of the first semiconductor memory device of the embodiment.

A via hole 120 is provided in the array chip 100. The via hole 120 penetrates the array chip 100 and reaches the pad 122 of the circuit chip 200. The via hole 120 extends along the memory string MS and the columnar section CL. The pad 122 is exposed at the bottom of the via hole 120.

Figure 12:
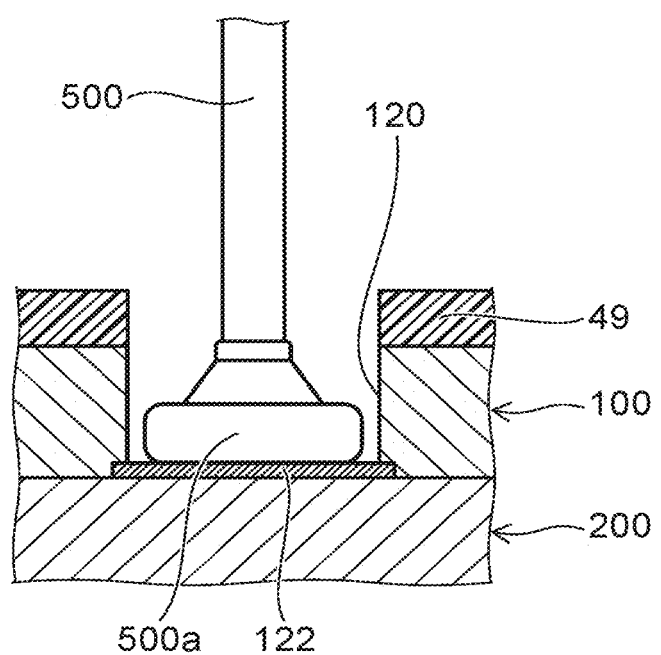
FIG. 12 is a schematic enlarged sectional view of a wire bonding portion of the semiconductor memory device of the first embodiment.

FIG. 12 is a schematic enlarged sectional view of a wire bonding portion of the semiconductor memory device of the first embodiment. Side faces of a wire 500 and a bump 500a are shown in FIG. 12.

For example, as shown in FIG. 12, the wire 500 is bonded to the pad 122 through the via hole 120. The wire 500 is, for example, an Au (gold) wire or an Ag (silver) wire. The bump 500a formed at the tip of the wire 500 is directly bonded to the pad 122.

The upper surface of the array chip 100 is covered with a protective film 49. The protective film 49 is, for example, a resin film.

Figure 13A:
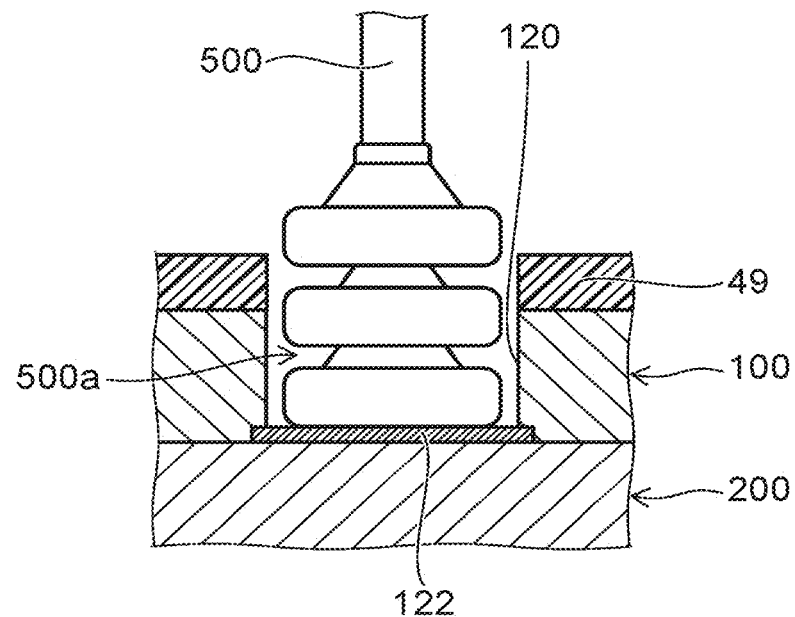
FIGS. 13A and 13B are schematic enlarged sectional views of a wire bonding portion of the semiconductor memory device of the first embodiment.
Figure 13B:
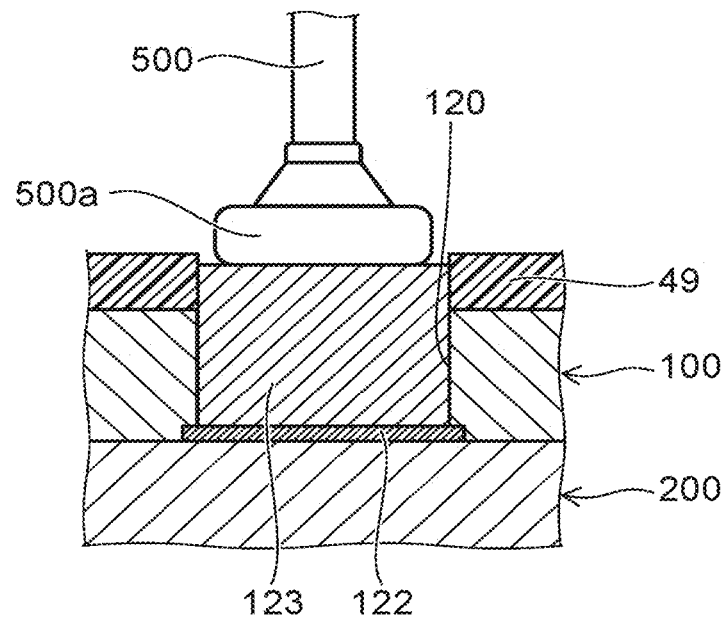

FIGS. 13A and 13B are schematic enlarged sectional views of a wire bonding portion of the semiconductor memory device of the first embodiment. Side faces of a wire 500 and a bump 500a are shown in FIGS. 13A and 13B.

In the example shown in FIG. 13A, the bump 500a is a stud bump having a plurality of bumps formed at the tip of the wire 500. The stud bump 500a is bonded to the pad 122 through the via hole 120. The height of the stud bump 500a is larger than the depth of the via hole 120. In this example, a capillary holding the wire 500 can be located above the upper surface of the protective film 49. The capillary, and also the wire 500, do not contact the protective film 49 and the side wall of the via hole 120 during the wire bonding process. This allows reduction in wire-bonding failure.

In the example shown in FIG. 13B, a conducting body 123 is provided on the pad 122 inside the via hole 120. The conducting body 123 contacts the pad 122. For example, the conducting body 123 is a Ni—Au alloy, and formed by plating. On the conducting body 123, no pad is formed. The bump 500a formed at the tip of the wire 500 is bonded to an upper surface of the conducting body 123.

In this example shown in FIG. 13B, a capillary holding the wire 500 can be located above the upper surface of the protective film 49. The capillary, and also the wire 500, do not contact the protective film 49 and the side wall of the via hole 120 during the wire bonding process. This allows reduction in bonding failure.

As shown in FIG. 6, the array wafer W1 is bonded to the circuit wafer W2. And then, after removing the substrate 10 of the array wafer W1, the via hole 120 is formed.

Figure 14:
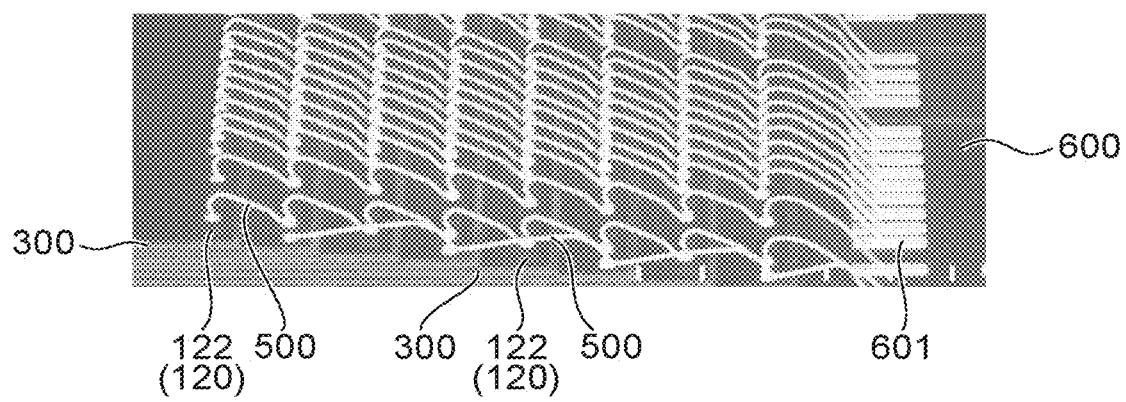
FIG. 14 is a SEM (scanning electron microscope) image of the semiconductor memory device of the first embodiment.

FIG. 14 is a SEM (scanning electron microscope) image of the semiconductor memory device of the first embodiment.

The semiconductor memory device shown in FIG. 14 includes a plurality of the semiconductor memory devices shown in FIGS. 11 to 13B.

A plurality of semiconductor memory devices (or chips) 300 is mounted on a wiring substrate 600 in which a wiring network (not illustrated) is provided on a surface, or inside, of an insulating resin substrate. Each of the semiconductor memory chips 300 includes the array chip 100 and the circuit chip 200 bonded to the array chip 100 as shown in FIG. 11 to 13B. The semiconductor memory chips 300 are stacked in a staircase configuration along at least one side of the semiconductor memory chips 300. The semiconductor memory chip 300 includes a plurality of the pads 122 (via holes 120) arrayed along and located at one side edge of the semiconductor memory chip 300. Each of the electrode pads 122 can be exposed for wire bonding. The wiring substrate 600 includes a plurality of electrodes 601. Each of the electrodes 601 is connected to the pads 122 on different semiconductor memory chips 300 by the wire 500.

Figure 15:
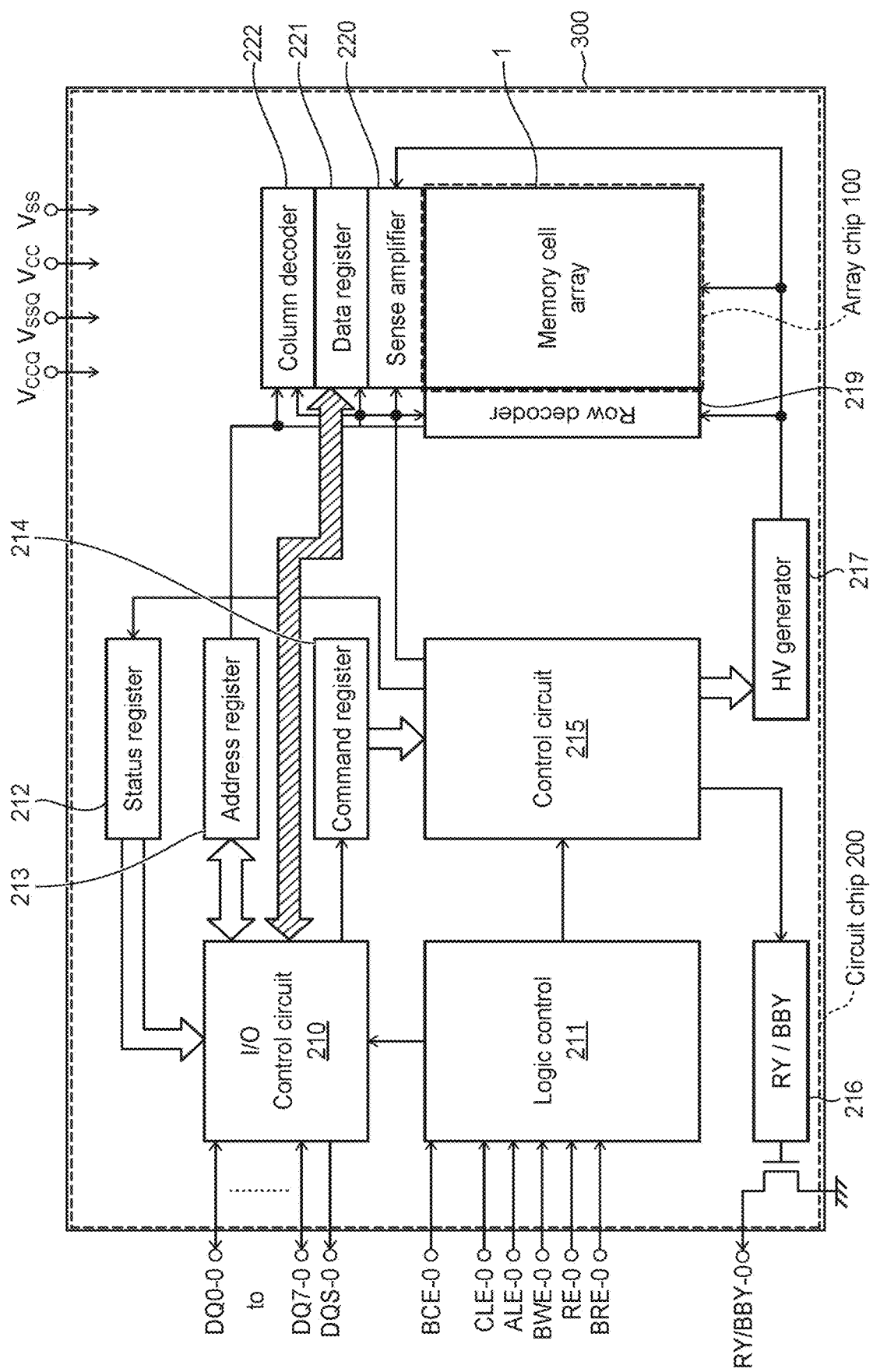
FIG. 15 is a block diagram of the semiconductor memory device of the first embodiment.

FIG. 15 is a block diagram of the semiconductor memory device 300 of the first embodiment.

The semiconductor memory device 300 of the embodiment is connected to a controller (not illustrated in FIG. 15). The controller receives instructions such as data write, data read, and data erase operation from a host device (not illustrated).

The controller issues commands in response to these instructions and transmits the commands to the semiconductor memory device 300. The semiconductor memory device 300 controls a data read operation, a data write operation, and a data erase operation by the received commands.

In FIG. 15, some of the connections between the respective blocks are indicated by solid arrow lines, but the connections between the blocks are not limited thereto.

As illustrated, the semiconductor memory device 300 includes the array chip 100 and the circuit chip 200. The array chip 100 includes, for example, the memory cell array 1. The circuit chip 200 includes the remaining components, for example, the I/O control circuit 210, the logic control circuit 211, the status register 212, the address register 213, the command register 214, the control circuit 215, the ready/busy circuit 216, the voltage generator 217, the row decoder 219, the sense amplifier 220, the data register 221, and the column decoder 222.

The logic control circuit 211 receives, for example, a chip enable signal BCE-0, a command latch enable signal CLE-0, an address latch enable signal ALE-0, a write enable signal BWE-0, and read enable signals RE-0 and BRE-0. The logic control circuit 211 controls the I/O control circuit 210 and the control circuit 215 in response to the received signals.

The chip enable signal BCE-0 is a signal for enabling the semiconductor memory device 300 and is asserted at a low level. The command latch enable signal CLE-0 is a signal indicating that an input/output signal I/O is a command, and is asserted at a high level. The address latch enable signal ALE-0 is a signal indicating that the input/output signal I/O is an address, and is asserted at a high level. The write enable signal BWE-0 is a signal for fetching the received signal into the semiconductor memory device 300 and is asserted at a low level whenever the command, the address, and the data are received from the controller. Therefore, whenever BWE-0 is toggled, the signal is fetched into the semiconductor memory device 300. The read enable signals RE-0 and BRE-0 are signals for enabling the controller to read each data from the semiconductor memory device 300. For example, the read enable signal BRE-0 is asserted at low level, and the read enable signal RE-0 is asserted at high level.

The I/O control circuit 210 controls the input and output of an 8-bit input/output signal I/O<0> to I/O<7> that is transmitted and received between the controller and the semiconductor memory 300 device through data lines DQ0-0 to DQ7-0.

More specifically, the I/O control circuit 210 includes an input circuit and an output circuit, and the input circuit receives a command signal, an address signal, and data and transmits them to the command register 214, the address register 213, and the data register 221. In addition, the output circuit transmits various data held by the semiconductor memory device 300 to the controller in response to the instruction from the controller.

The various data include, for example, memory data, ID data, parameter information, and status information. The memory data is, for example, data held in the data register 221. The ID data is unique identification information of the semiconductor memory device 300, such as a product number, a memory capacity and an interface specification. The parameter information is information such as a set value of a read voltage in a read operation. The status information is, for example, information indicating the result of the write operation or the like. Hereinafter, an operation of reading the memory data from the data register 221 is referred to as a "register read", an operation of reading the ID data is referred to as an "ID read", an operation of reading the parameter information is referred to as a "Get Feature", and data output by the Get Feature is referred to as "GF data".

The command register 214 temporarily stores a command signal received from the controller through the I/O control circuit 210 and transmits the command signal to the control circuit 215.

The control circuit 215 controls the status register 212, the ready/busy circuit 216, the voltage generator 217, the row decoder 219, the sense amplifier 220, the data register 221, and the column decoder 222 in response to the command signal held by the command register 214, and performs the data read operation, the data write operation, and the data erase operation.

The status register 212 temporarily holds a status in, for example, the data read operation, the data write operation, and the data erase operation, and notifies the controller of whether the operation has been normally completed.

The ready/busy circuit 216 transmits a ready/busy signal RY/BBY to the controller according to an operation condition of the control circuit 215. The ready/busy signal RY/BBY is a signal indicating whether the semiconductor memory device 300 is in a busy state (whether the semiconductor memory device 300 is in a state where the command is non-receivable from the controller or is in a state where the command is receivable from the controller) and is at a low level in the busy state.

The voltage generator 217 generates voltages necessary for the data read operation, the data write operation, and the data erase operation and applies the voltages to the memory cell array 1, the row decoder 219, and the sense amplifier 220, for example, through a driver (not illustrated).

The memory cell array 1 includes a plurality of transistors of memory cells MC (shown in FIGS. 4 and 5). For example, the transistor holds data corresponding to the threshold level.

The address register 213 temporarily holds an address signal received from the controller through the I/O control circuit 210. Then, the address register 213 transmits a row address to the row decoder 219 and transmits a column address to the column decoder 222.

For example, in the data write operation and the read operation, the row decoder 219 decodes the row address and selects the word line WL (electrode layer WL) according to the decoding result.

Then, the row decoder 219 applies an appropriate voltage to the word line WL.

For example, in the data write operation and the read operation, the column decoder 222 decodes the column address and selects a latch circuit inside the data register 221 according to the decoding result.

The data register 221 includes a plurality of latch circuits (not illustrated). The latch circuits correspond to the respective bit lines BL and hold write data and read data. For example, in the data write operation, the data register 221 temporarily holds data received from the controller through the I/O control circuit 210. In addition, for example, in the data read operation, the data register 221 temporarily holds data read by the sense amplifier 220 and transmits the data to the controller through the I/O control circuit 210.

In the data read operation, the sense amplifier 220 senses data read to the bit line BL from the transistor connected to the selected word line WL. In addition, in the data write operation, the sense amplifier 220 transmits the write data to the transistor connected to the selected word line WL. Hereinafter, the unit of data to be read and written in a batch by the sense amplifier 220 is referred to as a "page".

Figure 16:
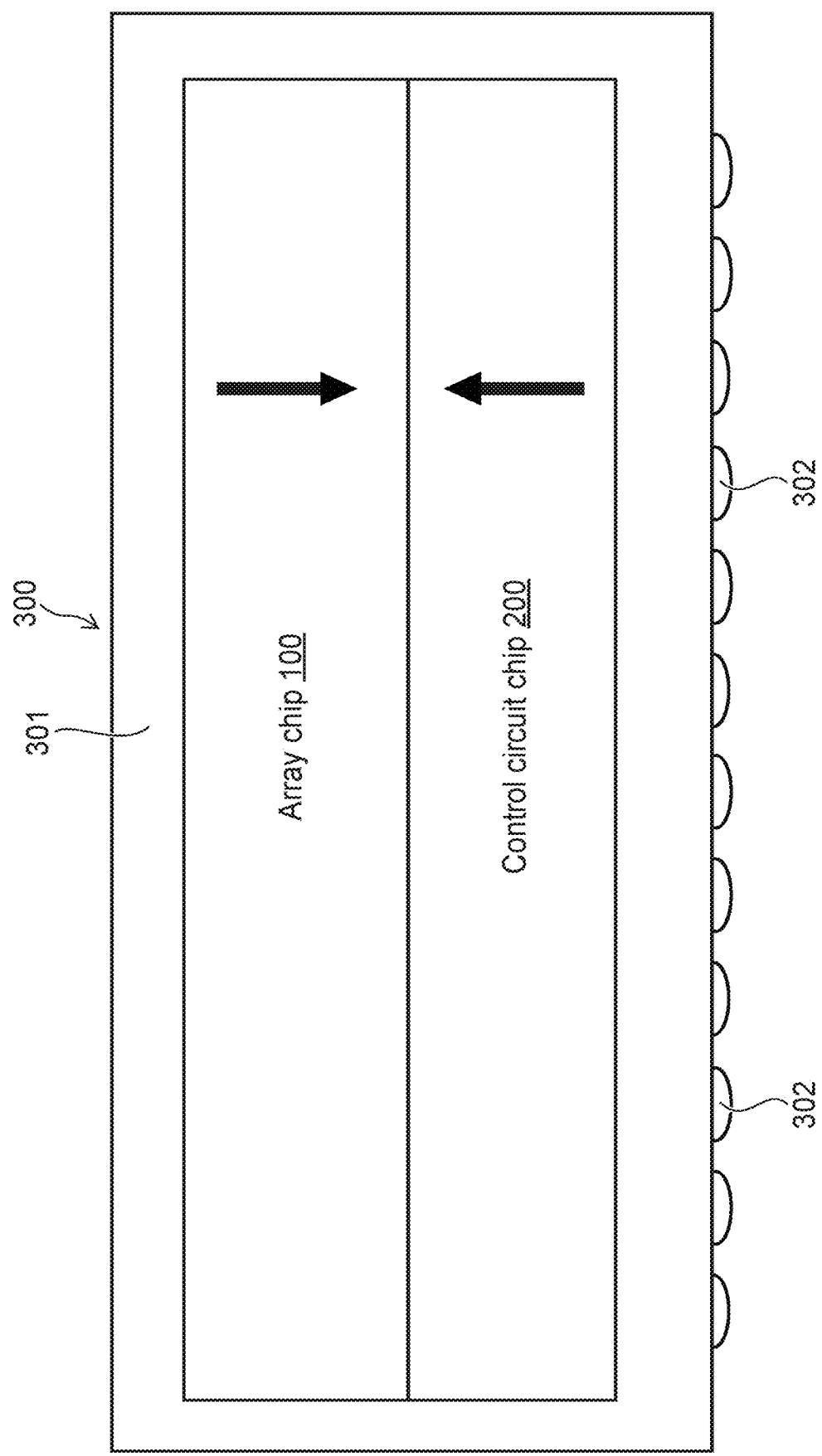
FIG. 16 is a schematic sectional view of a semiconductor memory device of the first embodiment.

FIG. 16 is a schematic sectional view of a semiconductor memory device 300 of the first embodiment.

The array chip 100 and the circuit chip 200 shown in FIG. 16 are bonded each other as shown in FIG. 11. The array chip 100 and the control circuit chip 200 are respectively laminated in directions indicated by arrows shown in FIG. 16.

The array chip 100 and the circuit chip 200 are accommodated in a package 301. The package 301 is a ball grid array (BGA) or a land grid array (LGA) package. A plurality of conductive balls (or pads) 302 are disposed on a lower surface of the package 301.

Figure 17:
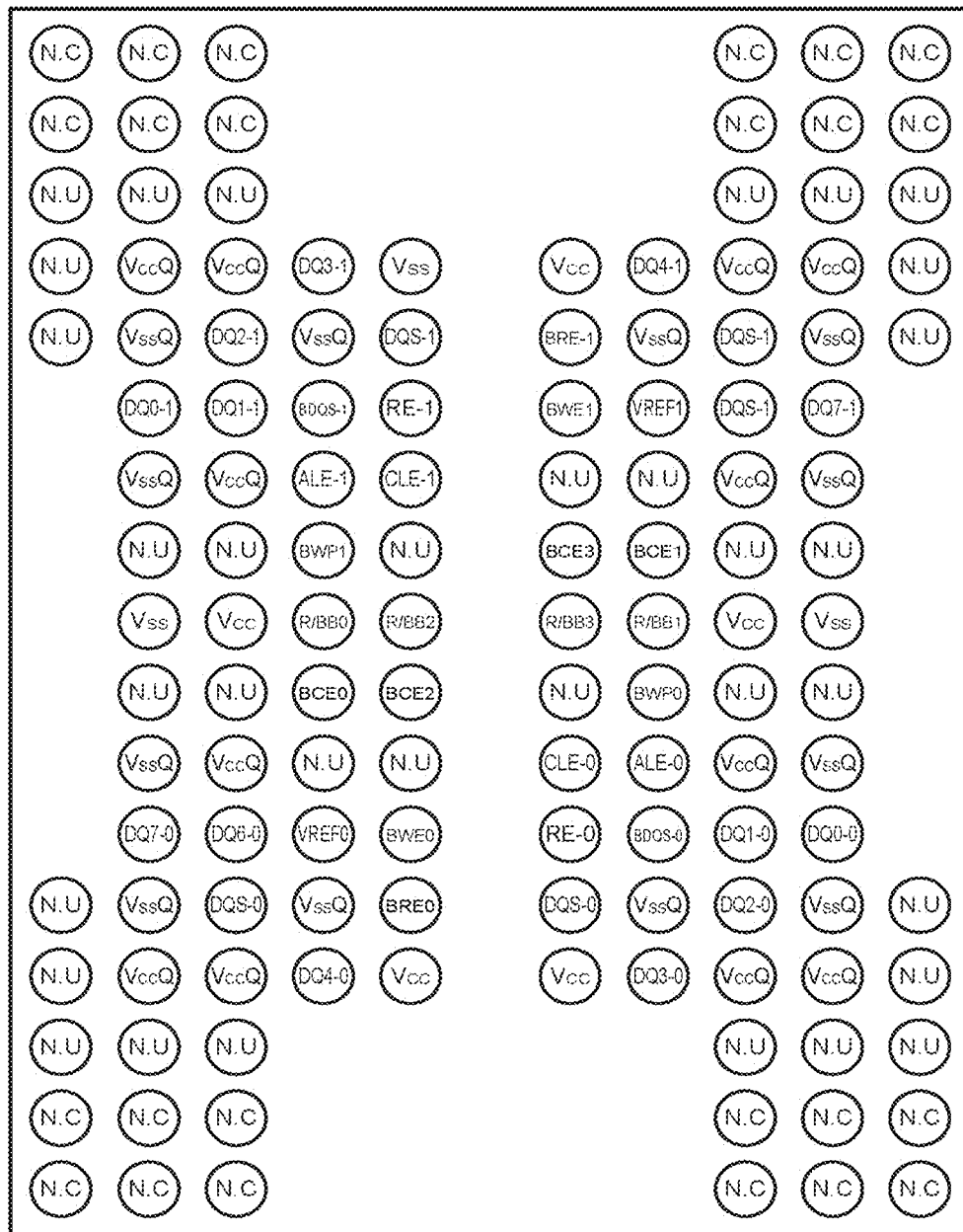
FIG. 17 is a schematic plan view showing the BGA (or LGA) pin assignment of the semiconductor memory device of the first embodiment.

FIG. 17 is a schematic plan view showing the BGA (or LGA) pin assignment. The signal codes shown in FIG. 17 correspond to the signal codes shown in FIG. 15.

Figure 18:
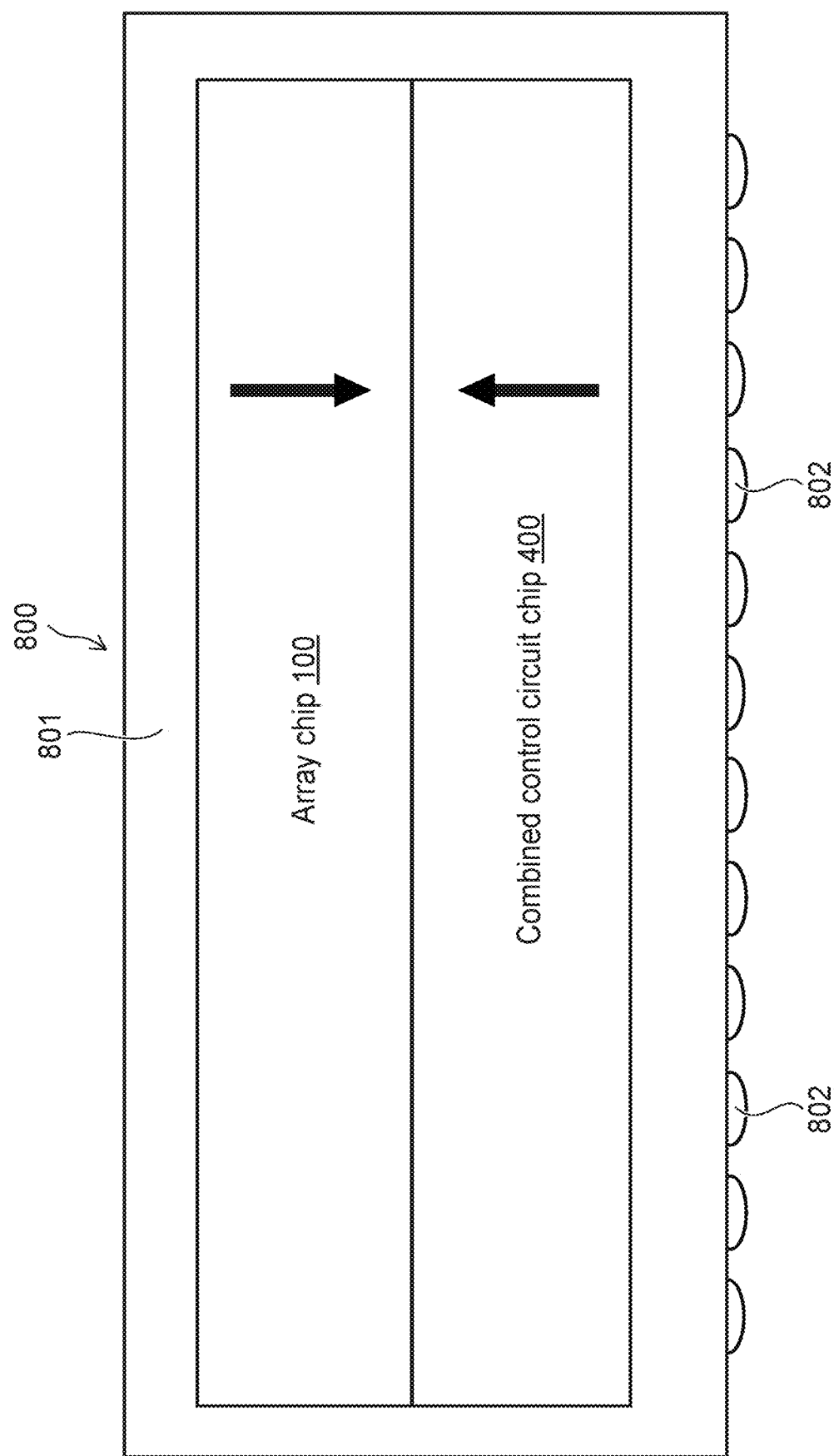
FIG. 18 is a schematic sectional view of a semiconductor memory system of a second embodiment.

FIG. 18 is a schematic sectional view of a semiconductor memory system 800 of a second embodiment.

The semiconductor memory system 800 shown in FIG. 18 includes the array chip 100 and a combined control circuit chip 400 bonded to the array chip 100. The combined control circuit chip 400 will be explained later. The array chip 100 and the combined control circuit chip 400 are respectively laminated in directions indicated by arrows shown in FIG. 18.

The array chip 100 and the combined control circuit chip 400 are accommodated in a package 801. The package 801 is a ball grid array (BGA) or a land grid array (LGA) package. A plurality of conductive balls (or pads) 802 are disposed on a lower surface of the package 801.

Figure 19:
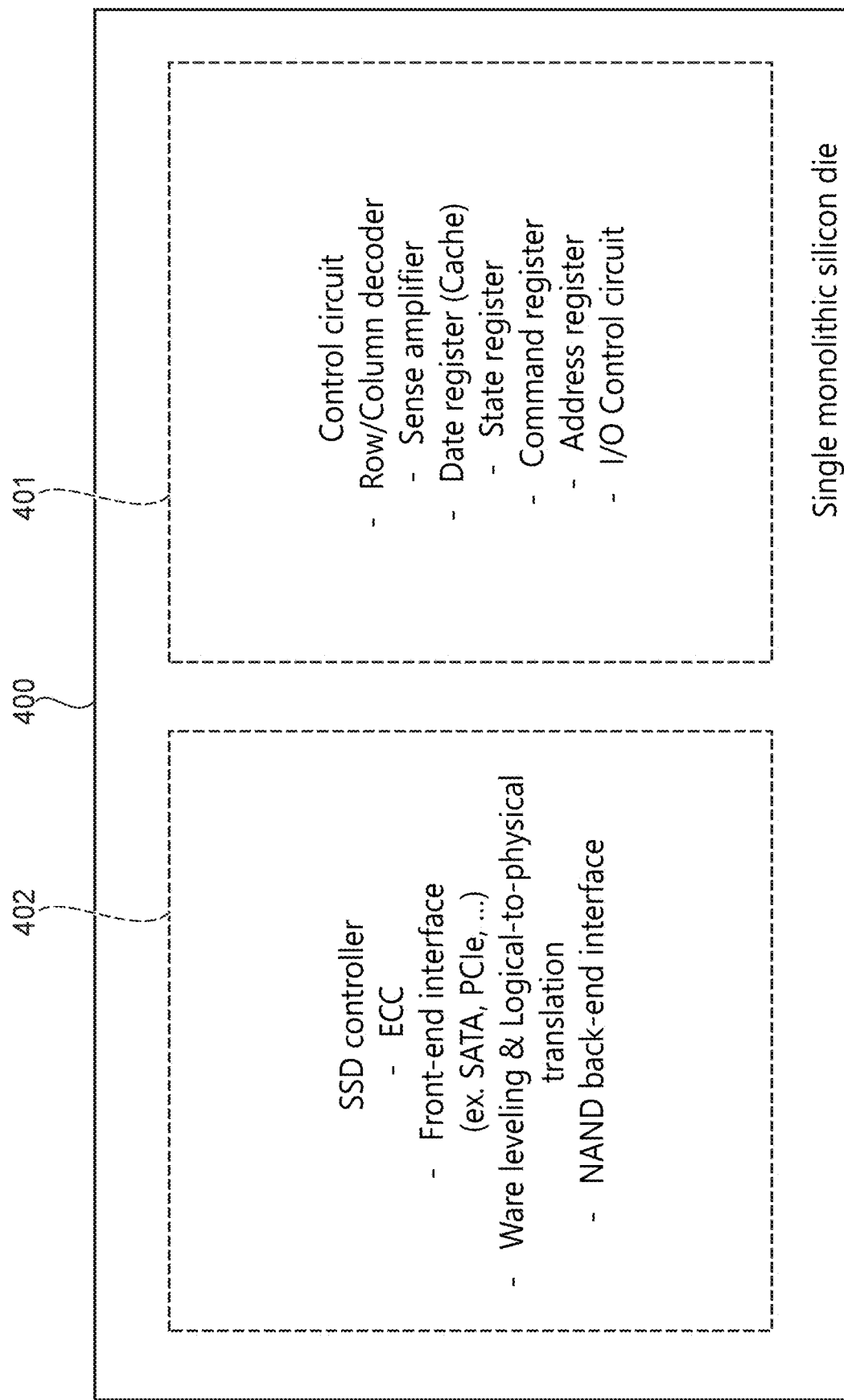
FIG. 19 is a schematic plan view of a combined control circuit chip of the semiconductor memory system of the second embodiment.

FIG. 19 is a schematic plan view of the combined control circuit chip 400 of the semiconductor memory system of the second embodiment.

The combined control circuit chip 400 includes a control circuit 401 and a solid state drive (SSD) controller 402.

The control circuit 401 includes the I/O control circuit 210, the logic control circuit 211, the status register 212, the address register 213, the command register 214, the control circuit 215, the ready/busy circuit 216, the voltage generator 217, the row decoder 219, the sense amplifier 220, the data register 221, and the column decoder 222 shown in FIG. 15.

The SSD controller 402 includes an error-correcting code (ECC), a front-end interface, a ware leveling and logical-to-physical translation, and NAND back-end interface.

The combined control circuit chip 400 is formed on a single monolithic silicon die.

Figure 20:
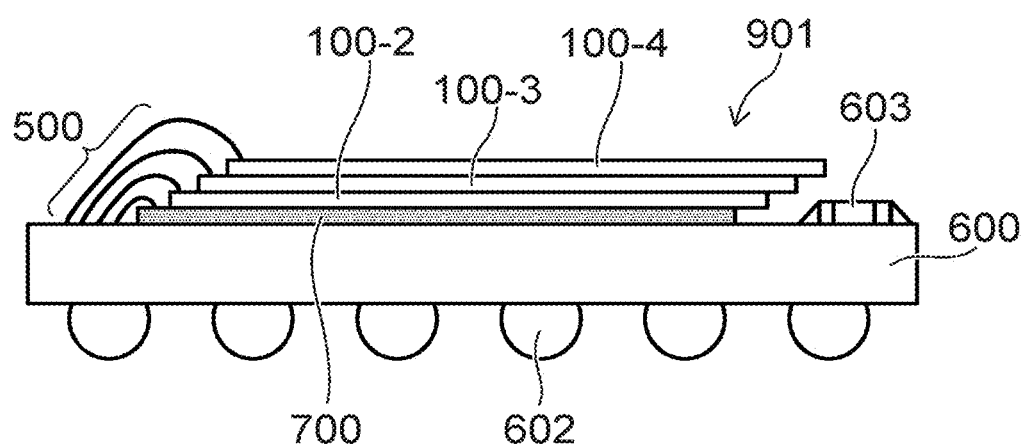
FIG. 20 is a schematic view of a semiconductor memory device of a third embodiment.

FIG. 20 is a schematic view of a semiconductor memory device of a third embodiment.

This semiconductor memory device includes a stacked device 901. The stacked device 901 is mounted on the circuit board 600. A passive device 603 is mounted on the circuit board 600. The passive device 603 is, for example, a chip capacitor. A plurality of conductive balls or pads 602 is disposed on a lower surface of the circuit board 600.

The stacked device 901 includes a circuit chip 700 and a plurality of array chips 100-2, 100-3, 100-4. The array chips 100-2, 100-3, 100-4 includes the previously mentioned memory cell array 1. The circuit chip 700 is a combined control chip including the memory cell array 1, the control circuit 401 shown in FIG. 19, and the SSD controller 402 shown in FIG. 19.

The array chip 100-2 is stacked on the circuit chip 700, the array chip 100-3 is stacked on the array chip 100-2, and the array chip 100-4 is stacked on the array chip 100-3.

Figure 21A:
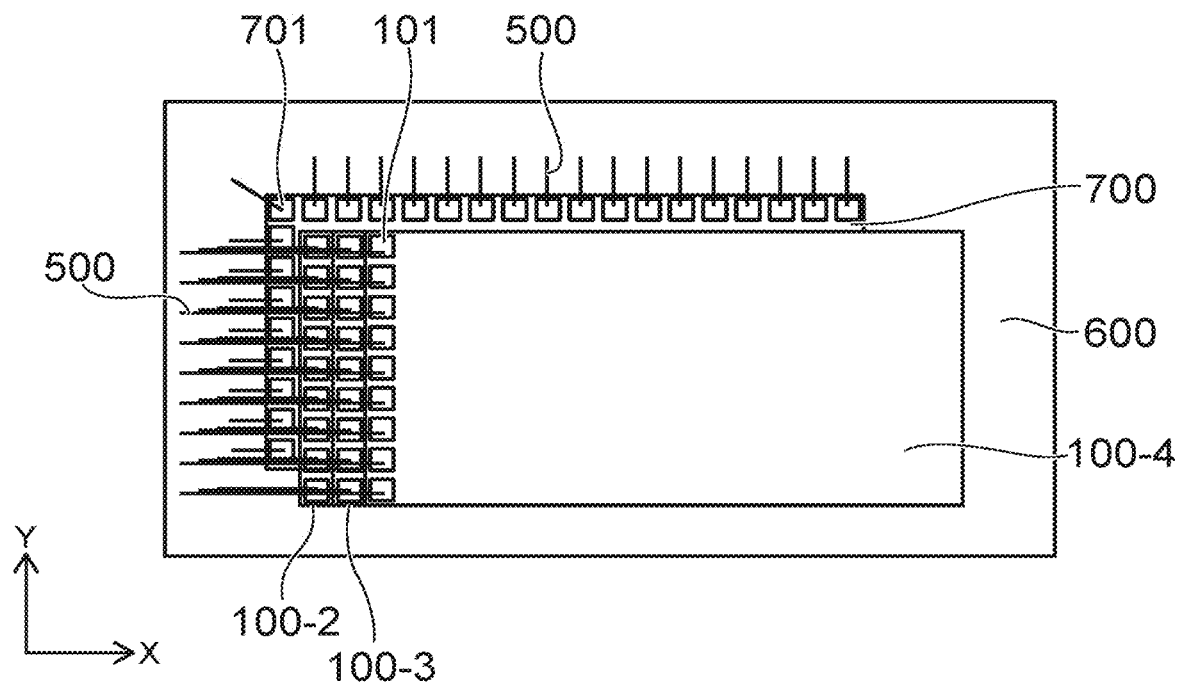
FIGS. 21A and 21B are schematic plan views of the semiconductor memory device shown in FIG. 20.

FIG. 21A is a schematic plan view of the semiconductor memory device shown in FIG. 20. In FIG. 21A, X-direction is along one side of the circuit chip 700 and a plurality of array chips 100-2, 100-3, 1004, and Y-direction is perpendicular to the X-direction.

The circuit chip 700 and the array chips 100-2, 100-3, 100-4 are stacked in a staircase configuration along the X-direction. The circuit chip 700 is offset in the Y-direction to the array chips 100-2, 100-3, 100-4.

A plurality of pads 101 is disposed on end portions of the array chips 100-2, 100-3, 100-4. The end portions are formed in a staircase configuration. The pads 101 are arranged along the Y-direction.

A plurality of pads 701 is disposed on an end portion in the X-direction of the circuit chip 700 and an end portion in the Y-direction of the circuit chip 700. The pads 701 disposed on the end portion in the X-direction of the circuit chip 700 are arranged along the Y-direction. The pads 701 disposed on the end portion in the Y-direction of the circuit chip 700 are arranged along the X-direction.

Each of the pads 101, 701 is electrically connected to the pad formed on the circuit board 600 by the wire 500.

The number of the pads of the circuit chip 700 including the memory cell array 1, the control circuit 401, and the SSD controller 402 is greater than the number of the pads of the array chips 100-2, 100-3, 100-4. The pads 701 are arranged along two sides of the circuit chip 700. The circuit chip 700 is offset in the X-direction and the Y-direction to the array chips 100-2, 100-3, 100-4.

Figure 21B:
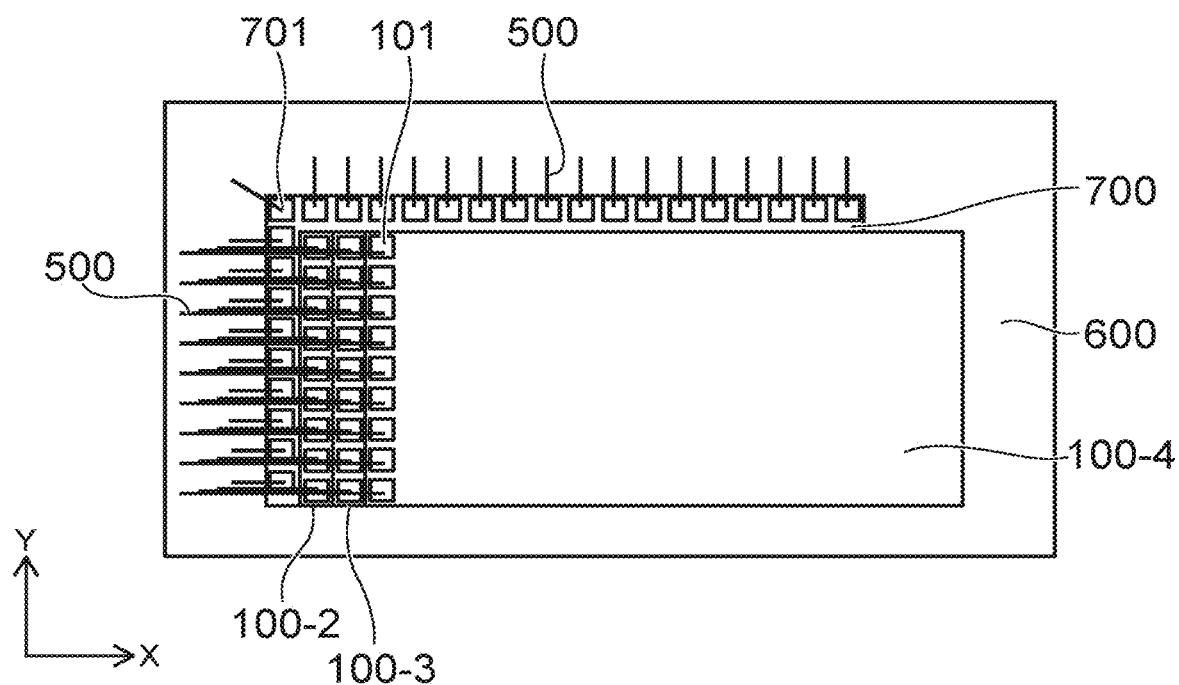

As shown in FIG. 21B, the size in the Y-direction of the circuit chip 700 may be larger than the size in the Y-direction of the array chips 100-2, 100-3, 100-4.

Figure 22A:
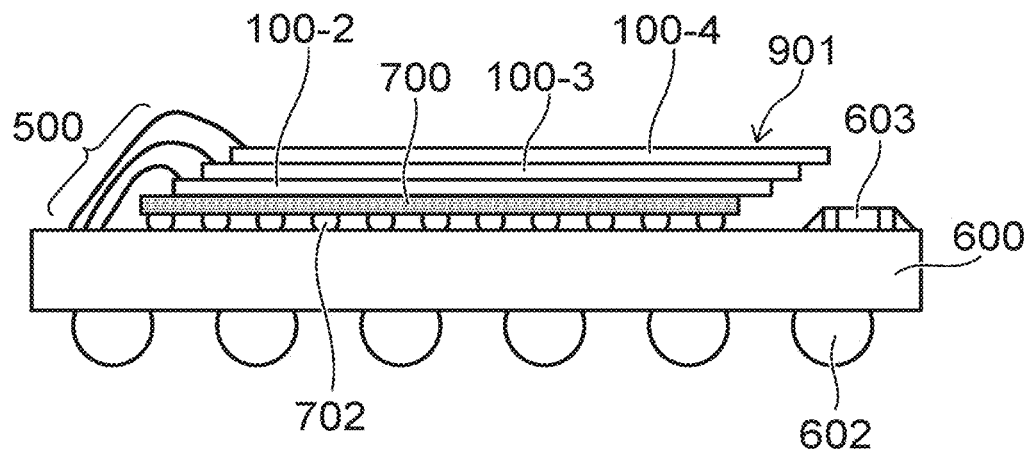
FIG. 22A to FIG. 24B are schematic views of another example of the semiconductor memory device of the third embodiment.

As shown in FIG. 22A, a plurality of conductive balls 702 may be disposed on a lower surface of the circuit chip 700. The circuit chip 700 is electrically connected to the circuit board 600 through the conductive balls 702.

Figure 22B:
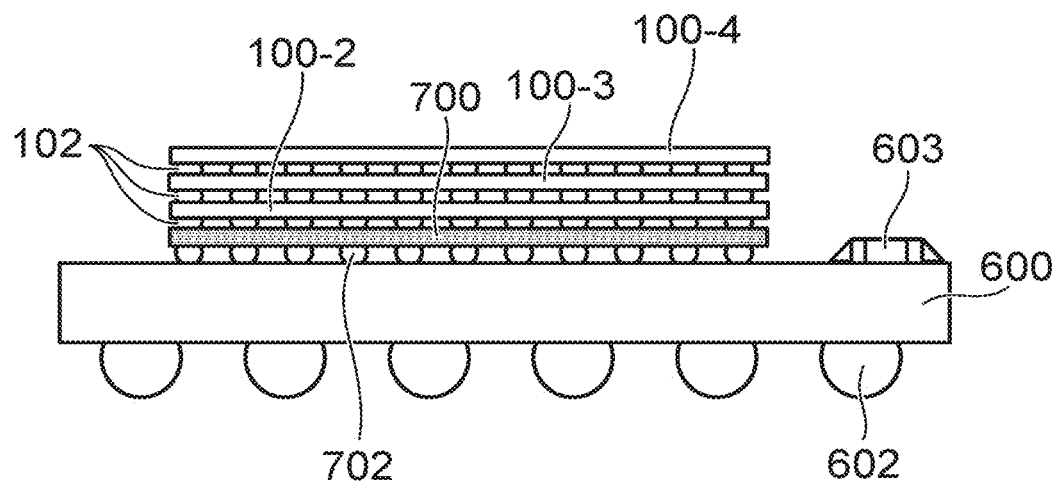

As shown in FIG. 22B, a plurality of conductive balls or bumps 102 may connect the circuit chip 700 and the array chips 100-2. The conductive balls or bumps 102 may connect the array chips 100-2 and the array chips 100-3. The conductive balls or bumps 102 may connect the array chips 100-3 and the array chips 100-4.

Figure 23A:
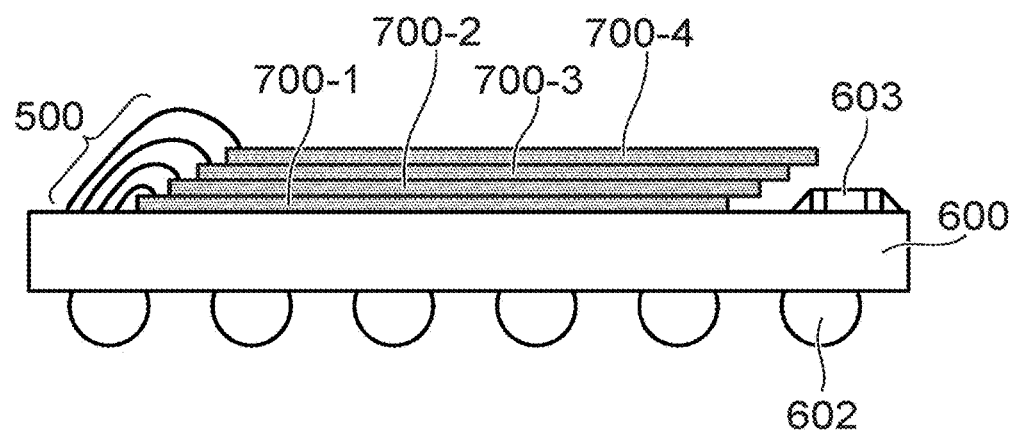

As shown in FIG. 23A, a plurality of circuit chips 700-1, 700-2, 700-3, 700-4 may be stacked in a staircase configuration on the circuit board 600. Each of the circuit chips 700-1, 700-2, 700-3, 700-4 is a combined control circuit chip, and includes the memory cell array 1, the control circuit 401, and the SSD controller 402.

Figure 23B:
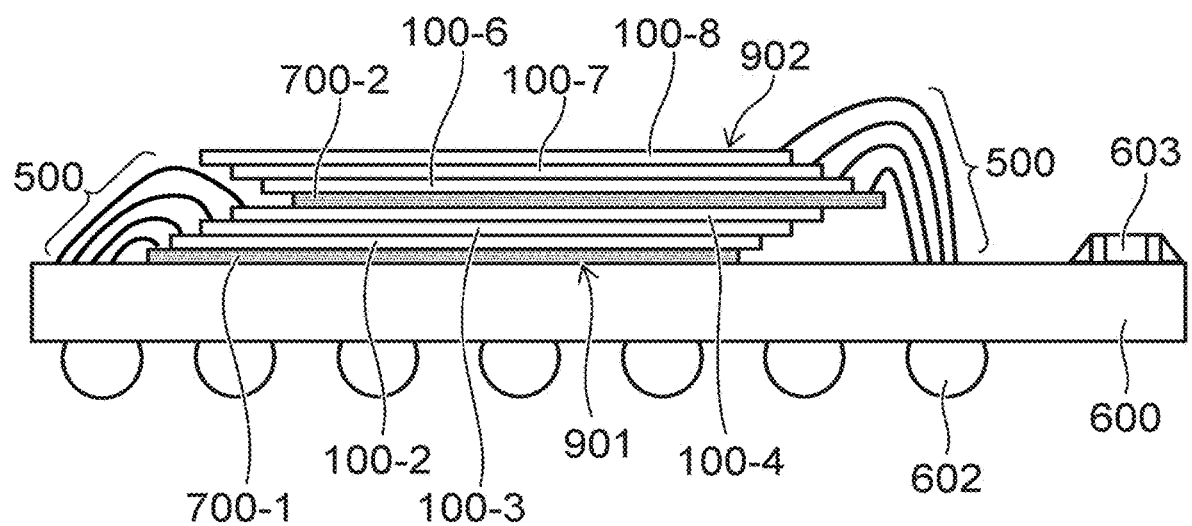

As shown in FIG. 23B, a plurality of stacked chips 901, 902 may be stacked on the circuit board 600.

The stacked chip 901 includes the circuit chip 700-1, the array chip 100-2, the array chip 100-3, and the array chip 100-4 stacked in a staircase configuration. The stacked chip 902 includes the circuit chip 700-2, the array chip 100-6, the array chip 100-7, and the array chip 100-8 stacked in a staircase configuration.

Each of the circuit chip 700-1, the array chip 100-2, the array chip 100-3, and the array chip 100-4 of the stacked chip 901 includes a first end portion. The first end portion of a lower chip protrudes in a first direction than the first end portion of an upper chip. The first end portions are electrically connected to the circuit board 600 by the wires 500.

Each of the circuit chip 700-2, the array chip 100-6, the array chip 100-7, and the array chip 100-8 of the stacked chip 902 includes a second end portion. The second end portion of a lower chip protrudes in a second direction opposite to the first direction than the second end portion of an upper chip. The second end portions are electrically connected to the circuit board 600 by the wires 500.

Figure 24A:
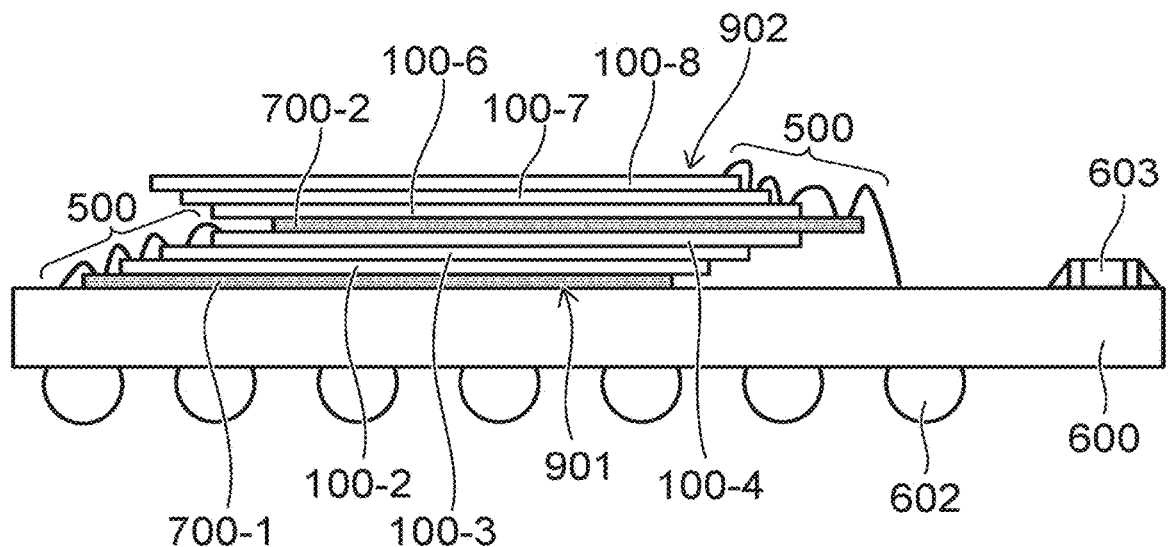

As shown in FIG. 24A, the array chips 100-2, 100-3, 100-4 of the stacked chip 901 may be connected each other by the wires 500. The circuit chip 700-1 may be connected to the array chip 100-2 by the wire 500. The circuit chip 700-1 may be connected to the circuit board 600 by the wire 500. The array chips 100-6, 100-7, 100-8 of the stacked chip 902 may be connected each other by the wires 500. The circuit chip 700-2 may be connected to the array chip 100-6 by the wire 500. The circuit chip 700-2 may be connected to the circuit board 600 by the wire 500.

Figure 24B:
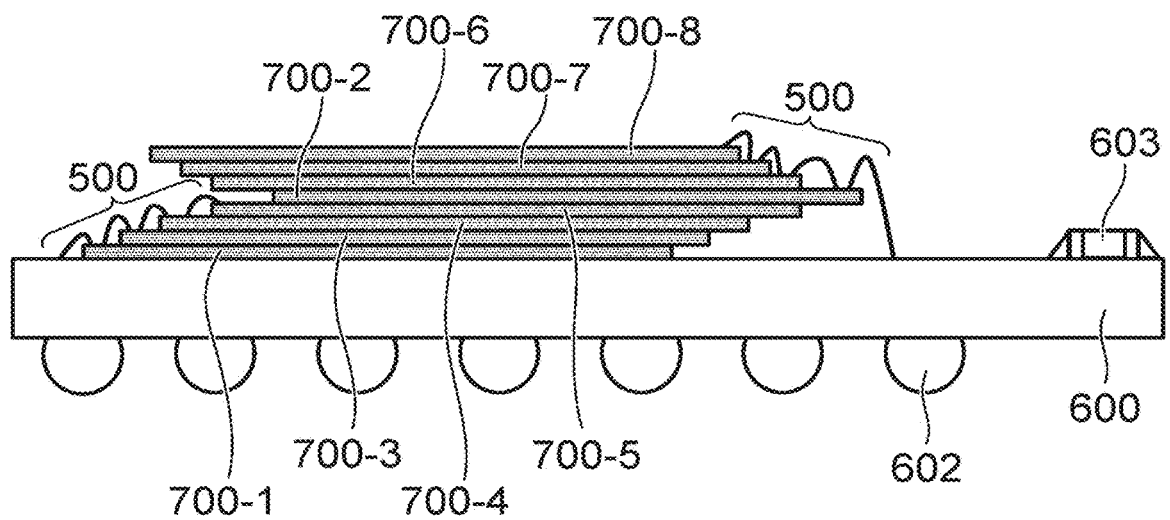

As shown in FIG. 24B, the array chip 100-2 shown in FIG. 24A may be replaced by the circuit chip 700-3. The array chip 100-3 shown in FIG. 24A may be replaced by the circuit chip 700-4. The array chip 100-4 shown in FIG. 24A may be replaced by the circuit chip 700-5. The array chip 100-6 shown in FIG. 24A may be replaced by the circuit chip 700-6. The array chip 100-7 shown in FIG. 24A may be replaced by the circuit chip 700-8.

Figure 25:
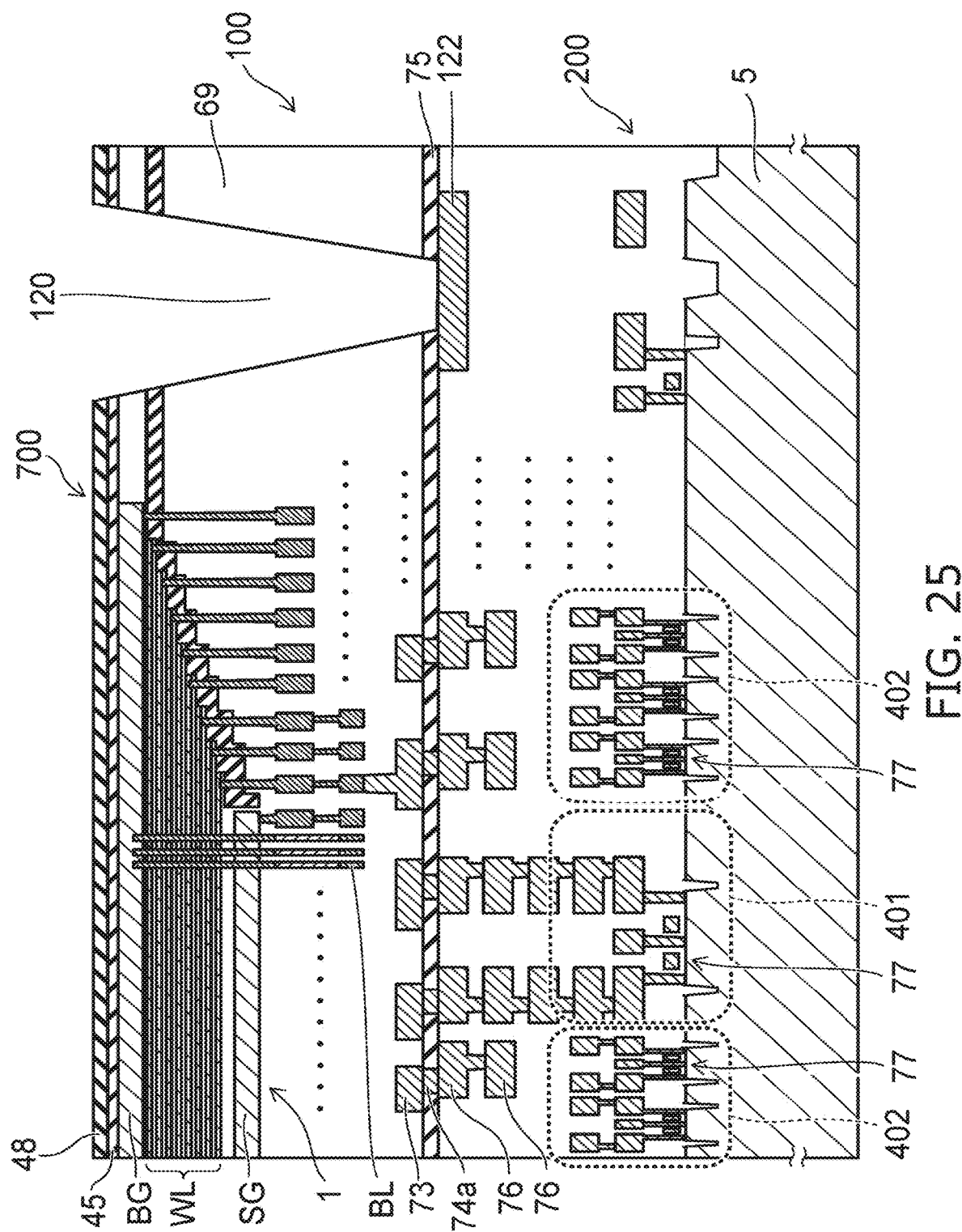
FIG. 25 is a schematic sectional view of a circuit chip 700.

FIG. 25 is a schematic sectional view of the circuit chip 700. The same components as in FIG. 11 are denoted by the same reference numerals and signs.

The circuit chip 700 includes the array chip 100 and the circuit chip (or CMOS chip) 200. The array chip 100 is bonded to the circuit chip 200 by the bonding metal 74a.

The array chip 100 includes the memory cell array 1.

The circuit chip 200 includes the substrate 5, and the control circuit 401 and the SSD controller 402 provided on the substrate 5. Each of the control circuit 401 and the SSD controller 402 includes a plurality of transistors 77 and the interconnection layer 76.

The interconnection layer 76 of the control circuit 401 is electrically connected to the interconnection layer 73 of the array chip 100 through the bonding metal 74a.

The control circuit 401 and the SSD controller 402 are electrically connected each other through the interconnection layer of the circuit chip 200.

Figure 26:
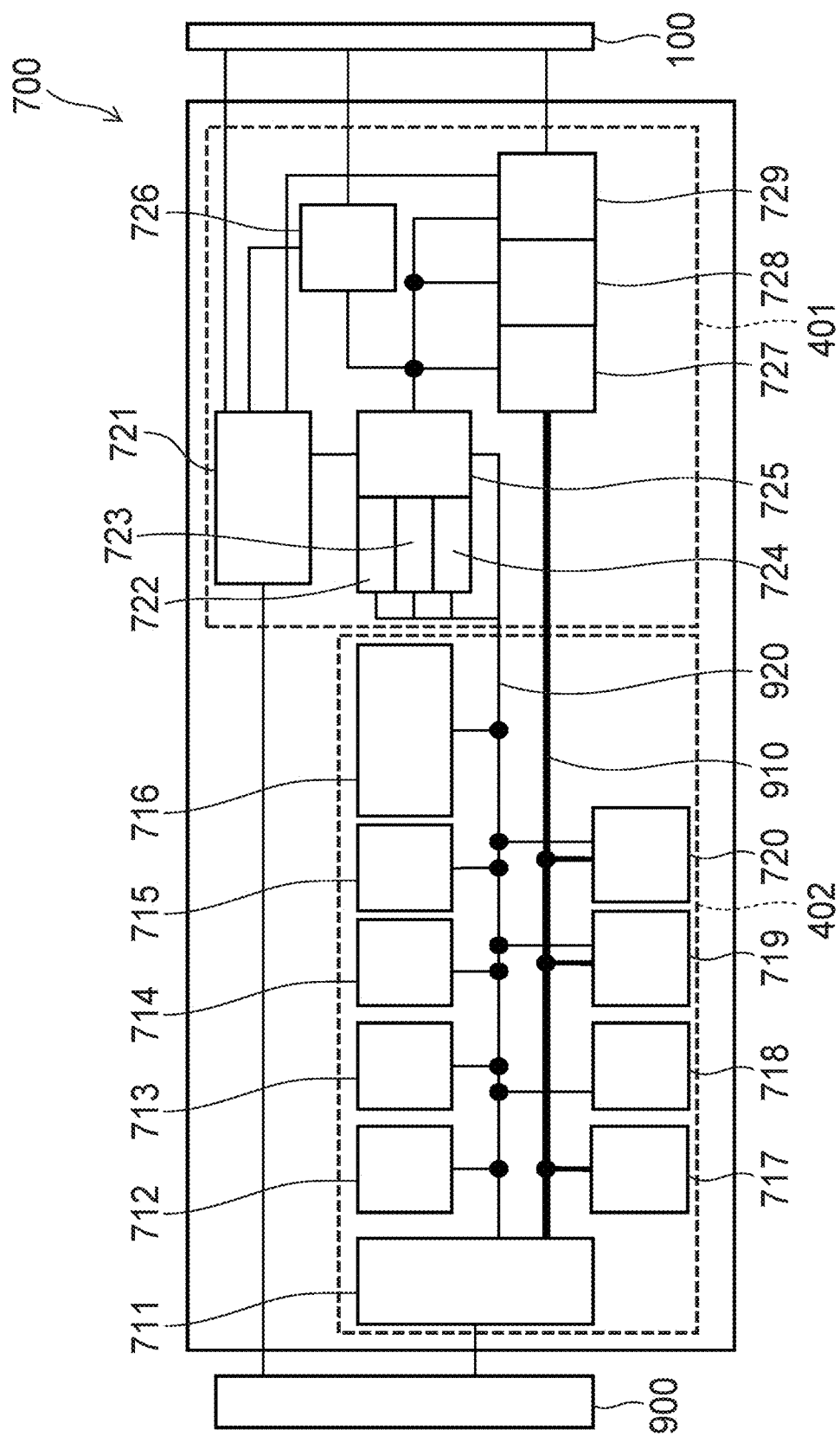
FIG. 26 is a block diagram of the circuit chip 700.

FIG. 26 is a block diagram of the circuit chip 700.

The circuit chip 700 includes the array chip 100, the control circuit 401, and the SSD controller 402. The control circuit 401 is connected to an input-output (I/O) portion of the array chip 100. The SSD controller 402 is connected to an external host system 900. The control circuit 401 and the SSD controller 402 are connected each other via a data bus 910 and a control bus 920.

The SSD controller 402 includes a host IF (interface) 711, a host IF controller 712, a host command controller 713, a wear leveling controller 714, a NAND block manager 715, a memory location manager 716, a data buffer controller 718, a data buffer 717, a cryptographic module 719, and an ECC (Error-Correcting-Code) processor 720.

The host IF 711 is connected to a host system 900, a data bus 910, and a control bus 920. The host IF controller 712, the host command controller 713, the wear leveling controller 714, the NAND block manager 715, the memory location manager 716, the data buffer 717, the cryptographic module 719, and the ECC processor 720 are connected to the control bus 920. The data buffer controller 718, the cryptographic module 719, and the ECC processor 720 are connected to the data bus 910.

The host IF 711 is an interface such as a serial advanced technology attachment (SATA), a serial attached SCSI (SAS), and a PCI express/non-volatile memory express (PCIe/NVMe).

The host IF controller 712 controls the host IF 711.

The host command controller 713 interprets the processing request or command (READ, WRITE) received from the host system 900 via the host IF 711, and controls another element in the storage for fulfill the request.

The data buffer 717 temporarily stores the data written from the host system 900 and the data read from NAND. The data buffer 717 is, for example, a memory (SRAM, DRAM) or a register. The memory is volatile or non-volatile.

The data buffer controller 718 manages the data buffer 717. The data buffer controller 718 manages the usage (for example, data in use or free) of the data buffer 717. The data buffer controller 718 manages the correspondence that which buffer is a data to be written in which area and in which NAND.

The ECC processor 720 encodes a data to be written to NAND, decodes a data read from NAND, detects and corrects an error.

The NAND block manager 715 manages the usage of the NAND block. The NAND block manager 715 manages also a bad block.

The wear leveling controller 714 manages the exhaustion. The wear leveling controller 714 monitors the whole of NAND and controls so that the exhaustion of the specific block does not progress too much. The wear leveling controller 714 controls the processing on read disturb and data retention.

The memory location manager 716 converts the so-called logical address between physical address. The memory location manager 716 converts the address specified by the host system 900 when requesting access between the address of NAND. The memory location manager 716 determines which area of NAND to write WRITE data upon receiving WRITE command from the host system 900.

The cryptographic module 719 performs various cryptographic processing on data.

The control circuit 401 includes a power source controller 721, a memory controller 725, an address register 722, a command register 723, a status resister 724, a row decoder 726, a column decoder 727, a data cache 728, and a sense amplifier 729.

The power source controller 721 is connected to the host system 900. The memory controller 725, the address register 722, the command register 723, and the status resister 724 are connected to the control bus 920. The column decoder 727 is connected to the data bus 910. The row decoder 726, the column decoder 727, the data cache 728, and the sense amplifier 729 are connected to the memory controller 725. The power source controller 721, the row decoder 726, and the sense amplifier 729 are connected to the input/output of the array chip 100.

The row decoder 726 controls the potentials of the electrode layer WL, the drain-side select gate SGD, and the source-side select gate SGS of the memory cell array 1. The sense amplifier 729 reads and amplifies the potential of the bit line BL.

The following describes data writing process.

The memory controller 725 receives a write request from the memory location manager 716. When the received write request cannot be executed immediately, the memory controller 725 records the address in the address register 722, and records the command in the command register 723.

When it comes to write processing, the memory controller 725 notifies that the data in the data buffer 717 will be written. The data is read from the data buffer 717, and encrypted in the cryptographic module 719. Subsequently, the data is error-corrected in the ECC processor 720.

The encoded data is transferred to the data cache 728, and waited until write start. After preparation, the data is transferred to the array chip 100 from the data cache 728, and written to the memory cell.

After the writing process, the memory controller 725 reflects the result in the status resister 724.

Next, the following describes data read process.

The memory location manager 716 instructs the memory controller 725 to read the data. When the received read request cannot be executed immediately, the memory controller 725 records the address in the address register 722, and records the command in the command register 723.

When it comes to read processing, the sense amplifier 729 reads the data from the memory cell of the array chip 100, and stores the data in the data cache 728.

The memory controller 725 inquires where in the data buffer 717 the read data should be transferred. The data stored in the data cache 728 is transferred to the ECC processor 720, and ECC is performed on the data. The corrected data is decrypted in the cryptographic module 719. The decrypted data is stored in the data buffer 717.

The memory controller 725 reflects the end of the read process in the status resister 724. The host command controller 713 instructs the host IF controller 712 to transfer the data. And then, the data is transferred to the host system 900 from the data buffer 717.

Figure 27:
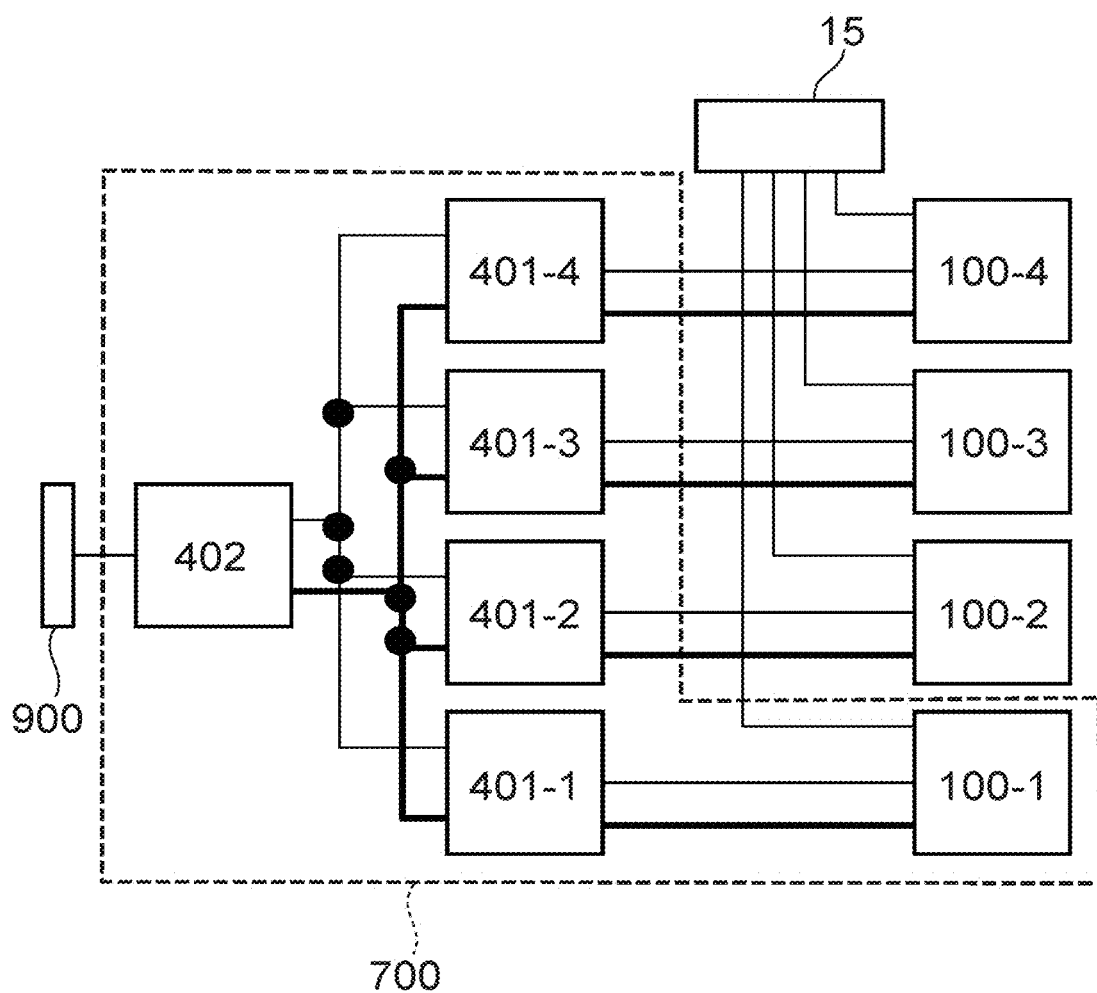
FIG. 27 and FIG. 28 are block diagrams of a stacked chip 901 shown in FIG. 20.

FIG. 27 is a block diagram of the stacked chip 901 shown in FIG. 20.

The stacked chip 901 includes the circuit chip 700, and the plurality of array chips 100-2, 100-3, 100-4. The circuit chip 700 is a combined control circuit chip including the SSD controller 402, the array chip 100-1, and the control circuits 401-1, 401-2, 401-3, 401-4. The control circuits 401-1, 401-2, 401-3, 401-4 include the same components as the above the control circuit 401.

The control circuit 401-1 is connected to the array chip 100-1. The control circuit 401-2 is connected to the array chip 100-2. The control circuit 401-3 is connected to the array chip 100-3. The control circuit 401-4 is connected to the array chip 100-4.

The array chips 100-1, 100-2, 100-3, 100-4 are connected to the power source 15 by the wires.

The control circuit 401-2 is connected to the array chip 100-2 by the wire or through silicon via (TSV). The control circuit 401-3 is connected to the array chip 100-3 by the wire or TSV. The control circuit 401-4 is connected to the array chip 100-4 by the wire or TSV.

The SSD controller 402 is connected to the host system 900 by the wire.

Figure 28:
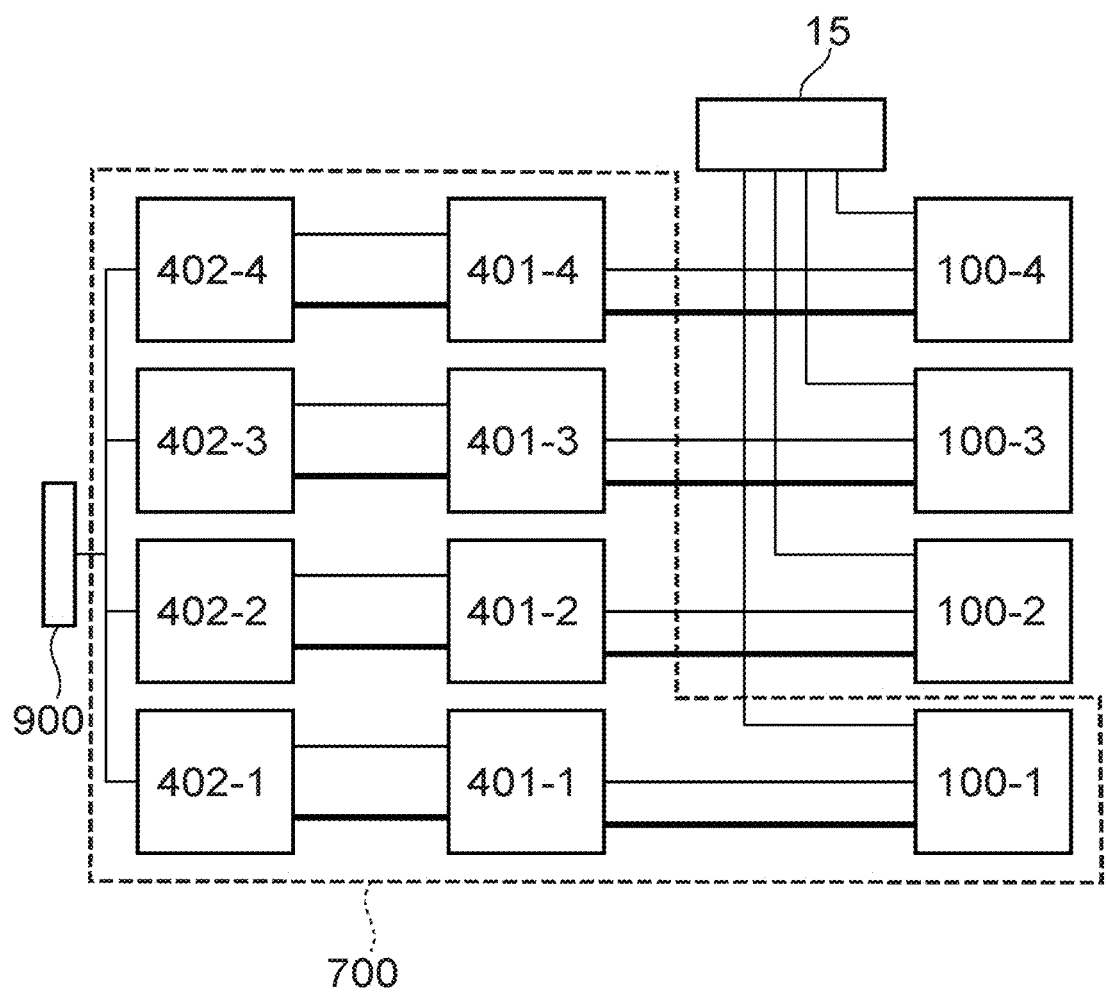

As shown in FIG. 28, the circuit chip 700 may include a plurality of SSD controllers 402-1, 402-2, 402-3, 402-4.

The SSD controller 402-1 is connected to the control circuit 401-1. The SSD controller 402-2 is connected to the control circuit 401-2. The SSD controller 402-3 is connected to the control circuit 401-3. The SSD controller 402-4 is connected to the control circuit 401-4.

According to a structure of FIG. 28, the elements controlling each array chips 100-1, 100-2, 100-3, 100-4 are separate. This structure can improve performance compare to the structure of FIG. 27.

The structure of FIG. 27 can reduce circuit area and power consumption compare to the structure of FIG. 28.

Figure 29:
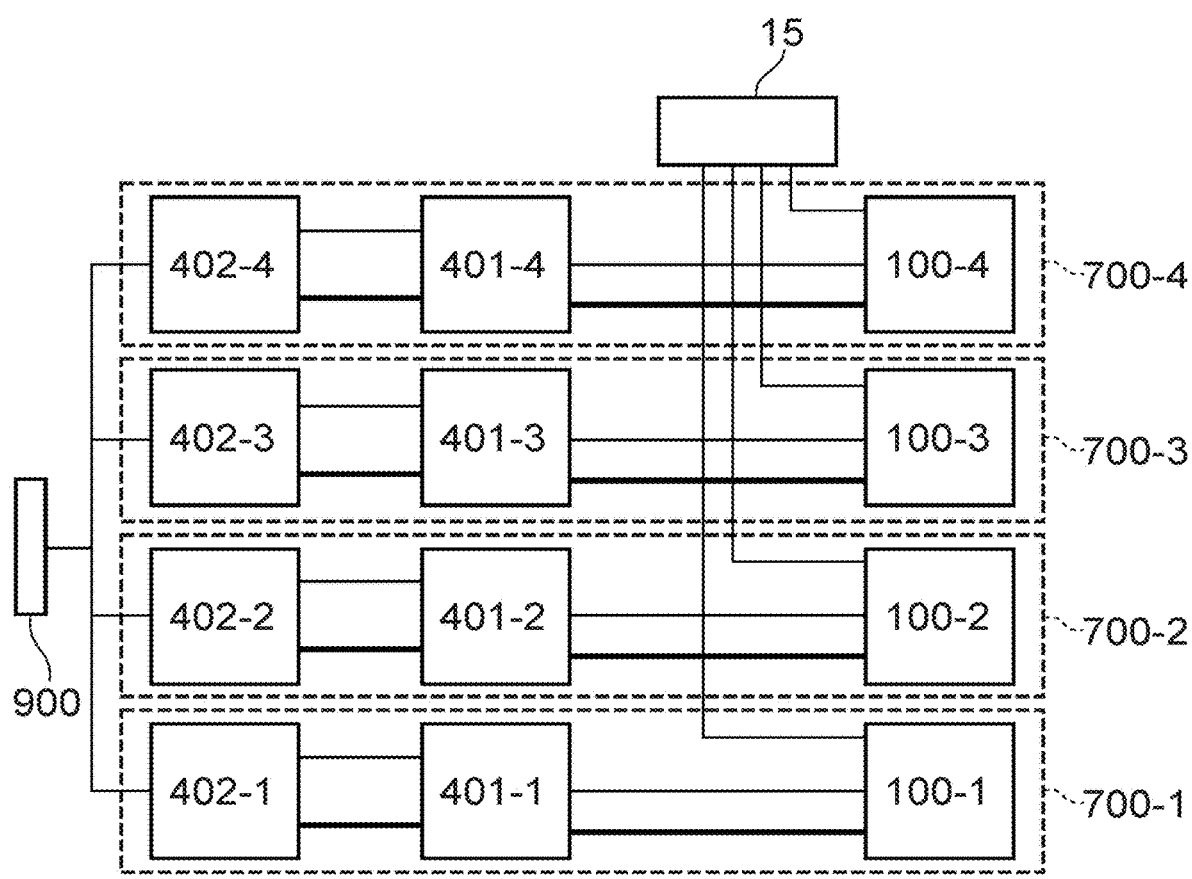
FIG. 29 and FIG. 30 are block diagrams of a stacked chip shown in FIG. 23A.

FIG. 29 is a block diagrams of the stacked chip shown in FIG. 23A.

The circuit chip 700-1 includes the SSD controller 402-1, the control circuit 401-1, and the array chip 100-1.

The circuit chip 700-2 includes the SSD controller 402-2, the control circuit 401-2, and the array chip 100-2.

The circuit chip 700-3 includes the SSD controller 402-3, the control circuit 401-3, and the array chip 100-3.

The circuit chip 700-4 includes the SSD controller 402-4, the control circuit 401-4, and the array chip 100-4.

The SSD controllers 402-1, 402-2, 402-3, 402-4 are connected to the host system 900 by wires.

The array chips 100-1, 100-2, 100-3, 100-4 are connected to a power source 15 by wires.

According to a structure of FIG. 29, the SSD controllers 402-1, 402-2, 402-3, 402-4 are connected to the host system 900 by wired-or.

Figure 30:
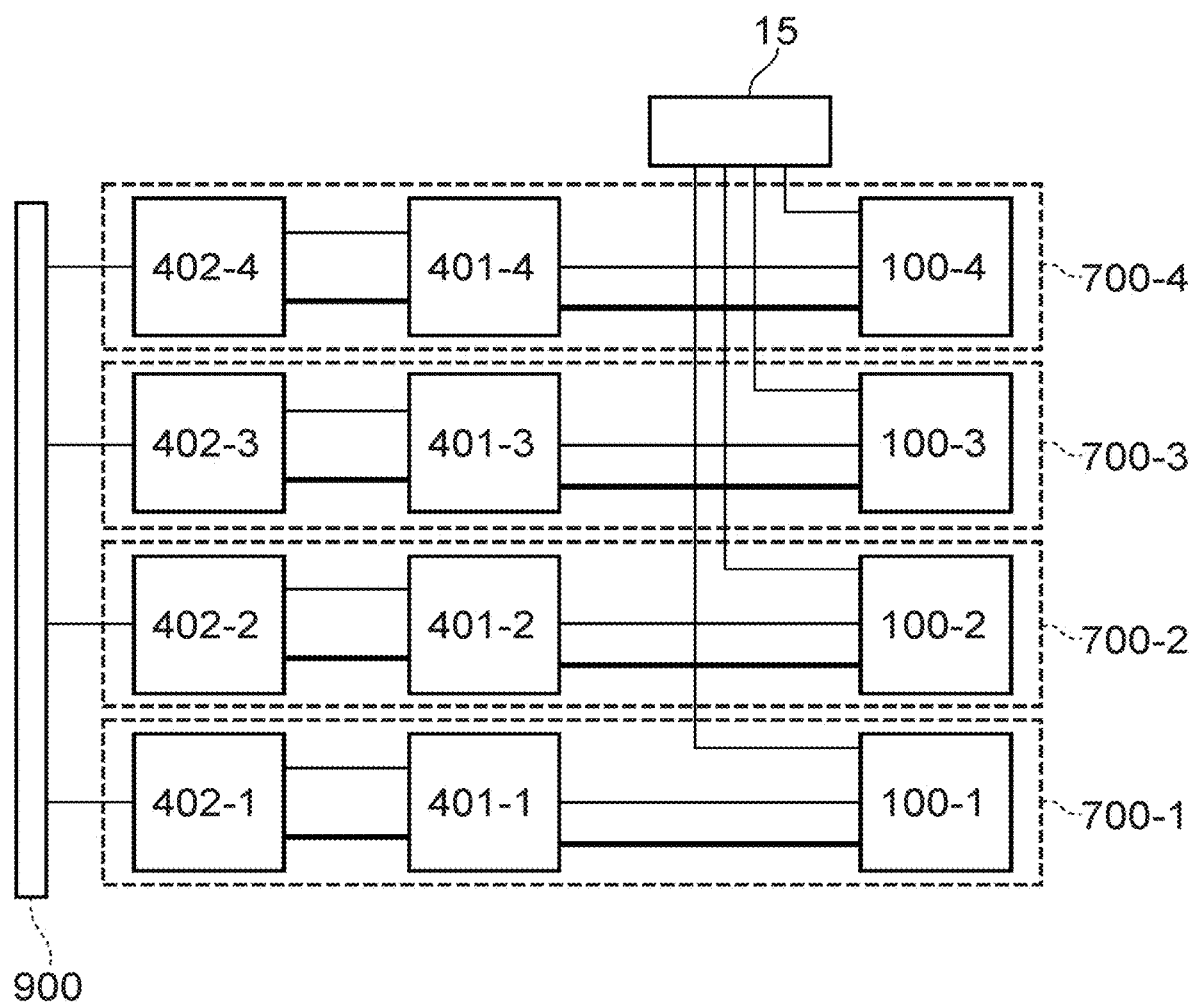

Or, as shown in FIG. 30, each of the SSD controllers 402-1, 402-2, 402-3, 402-4 may be connected to the host system 900 by a separate interconnect line.

Figure 31:
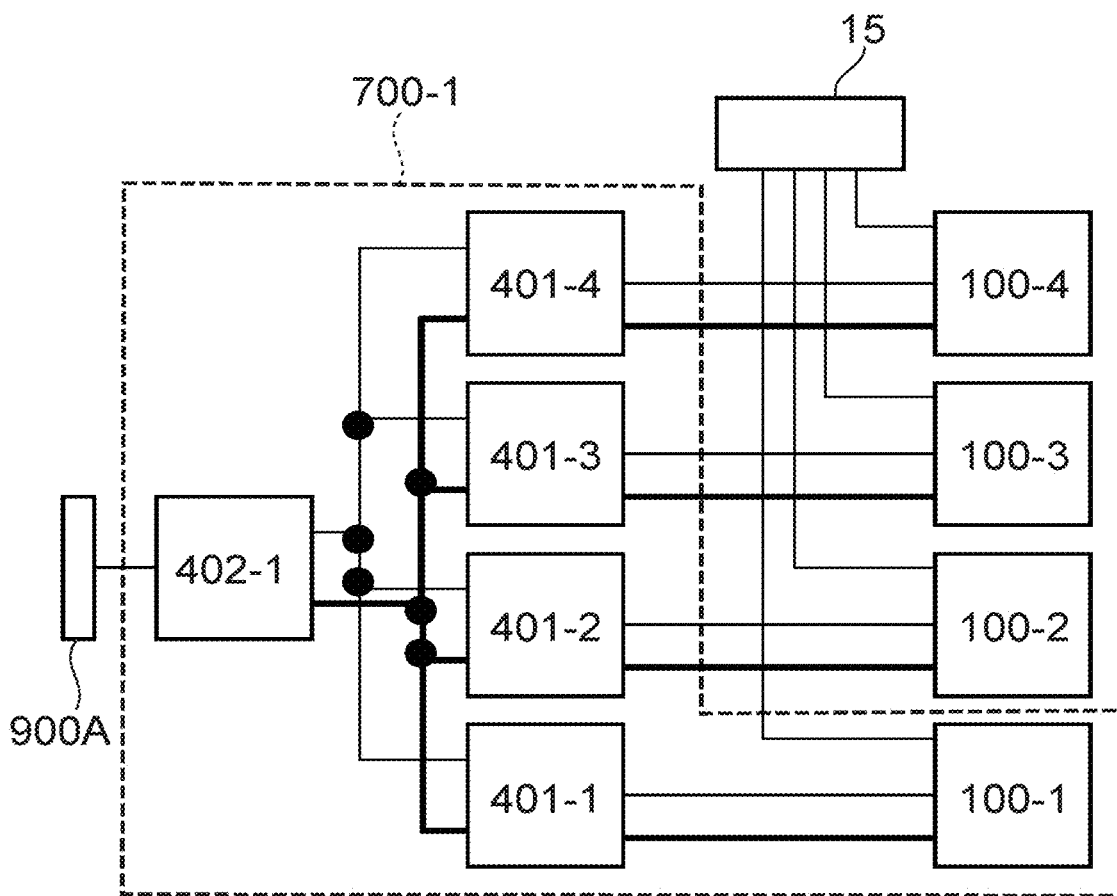
FIG. 31 is a block diagram of a stacked chip 901 shown in FIG. 23B.

FIG. 31 is a block diagram of the stacked chip 901 shown in FIG. 23B.

Figure 32:
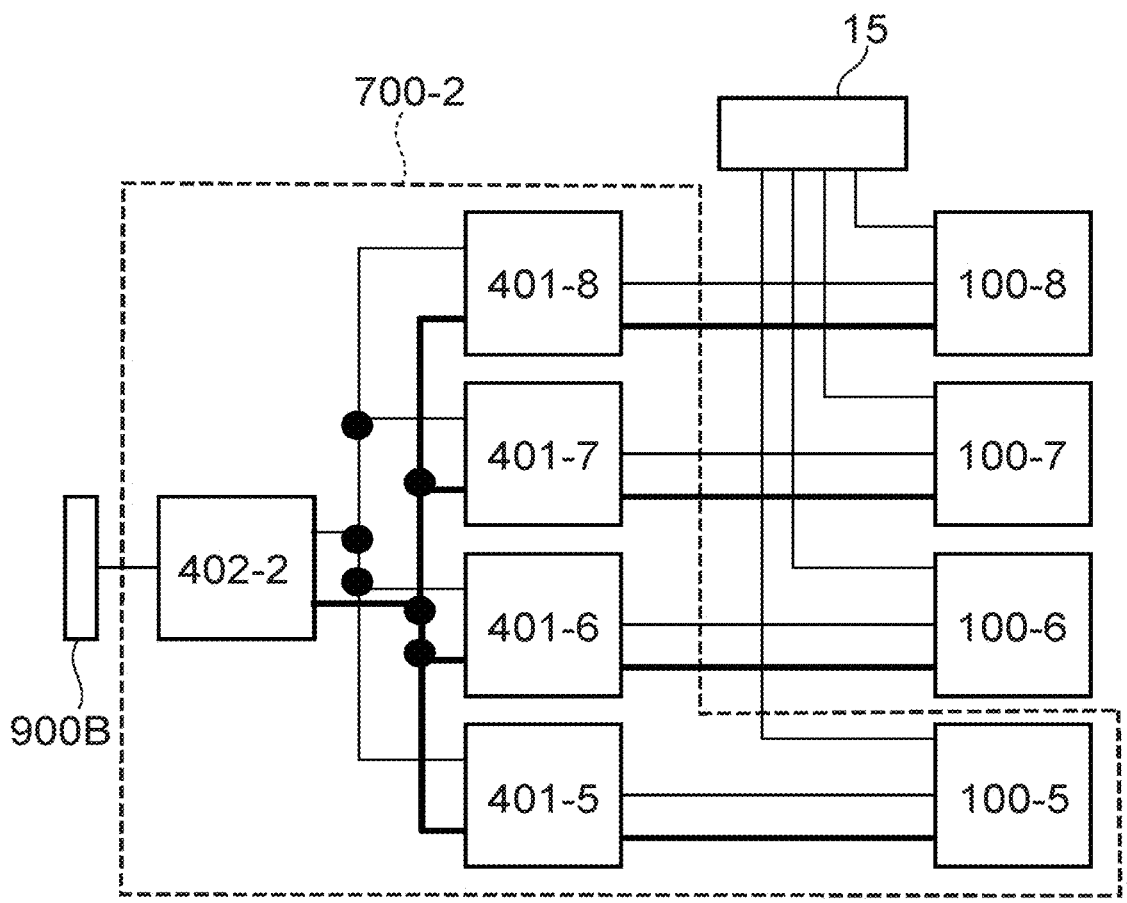
FIG. 32 is a block diagram of a stacked chip 902 shown in FIG. 23B.

FIG. 32 is a block diagram of the stacked chip 902 shown in FIG. 23B.

As shown in FIG. 31, the circuit chip 700-1 of the stacked chip 901 includes the SSD controller 402-1, the control circuit 401-1, 401-2, 401-3, 401-4, and the array chip 100-1.

The SSD controller 402-1 is connected to the host system 900A.

The control circuit 401-1 is connected to the array chip 100-1. The control circuit 401-2 is connected to the array chip 100-2. The control circuit 401-3 is connected to the array chip 100-3. The control circuit 401-4 is connected to the array chip 100-4.

As shown in FIG. 32, the circuit chip 700-2 of the stacked chip 902 includes the SSD controller 402-2, the control circuit 401-5, 401-6, 401-7, 401-8, and the array chip 100-5.

The SSD controller 402-2 is connected to the host system 900B.

The control circuit 401-5 is connected to the array chip 100-5. The control circuit 401-6 is connected to the array chip 100-6. The control circuit 401-7 is connected to the array chip 100-7. The control circuit 401-8 is connected to the array chip 100-8.

The array chips 100-2, 100-3, 100-4, 100-6, 100-7, 100-8 are connected to the power source 15 by wires.

The SSD controller 402-1 and the SSD controller 402-2 may be connected to the same host system by wired-or.

Figure 33:
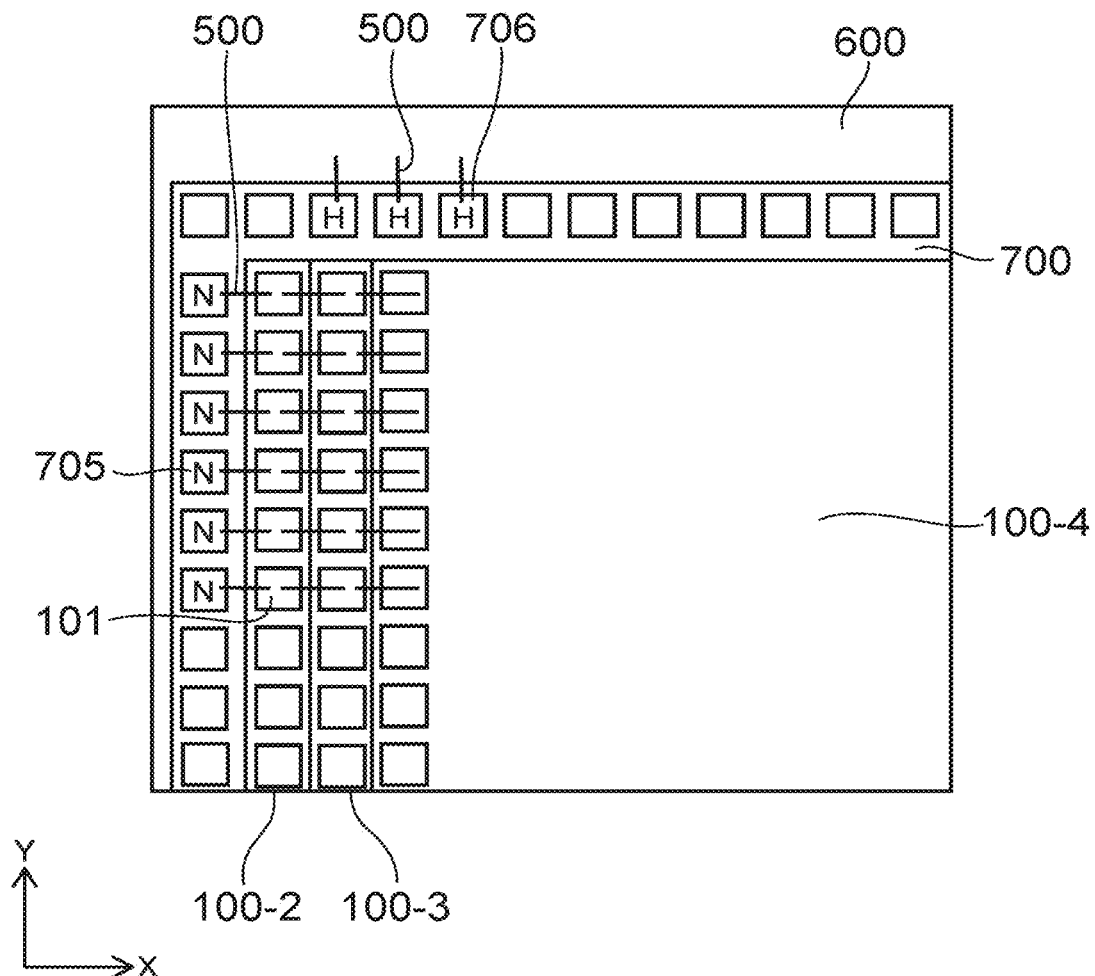
FIG. 33 is schematic view of a variation of FIGS. 21A and 21B.

FIG. 33 is schematic view of a variation of FIGS. 21A and 21B.

A plurality of pads 705 for NAND I/F is disposed on the end portion in the X-direction of the circuit chip 700. The pads 705 for NAND I/F are connected to the pads 101 of the array chips 100-2, 100-3, 100-4 by the wires 500.

A plurality of pads 706 for host is disposed on the end portion in the Y-direction of the circuit chip 700. The pads 706 for host are connected to the pads of the circuit board 600 by the wires 500.

According to a structure of FIG. 33, the end portion (side) of the circuit chip 700 in which the pads 705 for NAND I/F are disposed is different from the end portion (side) of the circuit chip 700 in which the pads 706 for host are disposed. This structure can reduce the arrangement pitch and area of the pads 705 for NAND I/F and the pads 706 for host.

The end portion (side) where the pads 101 of the array chips 100-2, 100-3, 100-4 are disposed is severely constrained by the package size since the array chips 100-2, 100-3, 100-4 are stacked in a staircase configuration. This may constrain the arrangement rule of the pads on the circuit board 600. In the structure of FIG. 33, the end portion (side) where the pads 101 of the array chips 100-2, 100-3, 100-4 are disposed is different from the end portion (side) connecting the circuit board 600. This structure can ease a restriction on the above rule.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
   a first chip mounted on a circuit board; and
   a second chip on the circuit board,
   the first chip including
      a circuit chip including a substrate, a control circuit provided on the substrate, a solid state drive controller provided on the substrate,
      a first array chip bounded to the circuit chip, and
      a plurality of bonding metals provided on bonding surfaces of the circuit chip and the first array chip, the first array chip including a plurality of first memory cells electrically connected to the control circuit via the plurality of bonding metals,
   the second chip including a second array chip, the second array chip including a plurality of second memory cells, wherein
   the solid state drive controller is configured to write data to the first array chip and the second array chip.

2. The device according to claim 1, wherein
   the solid state drive controller includes
      a first sub controller configured to write data to the first array chip, and
      a second sub controller configured to write data to the second array chip.

* * * * *